US011293949B2

(12) United States Patent
Tsuzaki et al.

(10) Patent No.: US 11,293,949 B2
(45) Date of Patent: Apr. 5, 2022

(54) CURRENT DETECTION APPARATUS AND POWER CONVERSION APPARATUS

(71) Applicant: Mitsubishi Electric Corporation, Tokyo (JP)

(72) Inventors: Yosuke Tsuzaki, Tokyo (JP); Shuichi Ueno, Tokyo (JP); Mitsuo Sone, Tokyo (JP); Masaaki Taruya, Tokyo (JP); Yoshiyuki Deguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 103 days.

(21) Appl. No.: 16/612,461

(22) PCT Filed: Feb. 1, 2018

(86) PCT No.: PCT/JP2018/003376
§ 371 (c)(1),
(2) Date: Nov. 11, 2019

(87) PCT Pub. No.: WO2018/230030
PCT Pub. Date: Dec. 20, 2018

(65) Prior Publication Data
US 2020/0096542 A1    Mar. 26, 2020

(30) Foreign Application Priority Data

Jun. 14, 2017    (JP) .............................. JP2017-116876

(51) Int. Cl.
*G01R 15/20*    (2006.01)
*G01R 19/00*    (2006.01)
(Continued)

(52) U.S. Cl.
CPC ......... *G01R 15/20* (2013.01); *G01R 19/0092* (2013.01); *H02M 1/00* (2013.01);
(Continued)

(58) Field of Classification Search
CPC ....... G01R 1/00; H01L 21/00; H01L 2221/00; H02J 1/00; H02M 1/00
See application file for complete search history.

(56) References Cited

U.S. PATENT DOCUMENTS 5,317,251 A    5/1994  Haviland et al.
9,651,583 B2 *  5/2017  Kawase ............... G01R 15/207
(Continued)

FOREIGN PATENT DOCUMENTS

CN    103547929 A    1/2014
JP    4-169881 A    6/1992
(Continued)

OTHER PUBLICATIONS

International Search Report for PCT/JP2018/003376 dated Apr. 17, 2018 [PCT/ISA/210].
(Continued)

*Primary Examiner* — Jermele M Hollington
*Assistant Examiner* — Temilade S Rhodes-Vivour
(74) *Attorney, Agent, or Firm* — Sughrue Mion, PLLC; Richard C. Turner

(57) ABSTRACT

In a current detection apparatus, one or more first plate portions, one or more second plate portions, and one or more third plate portions of one or more magnetic shields are opposed to side surfaces of the one or more protrusions. The one or more protrusions, the one or more magnetic field detection elements, and one or more conductive members are respectively surrounded by the one or more magnetic shields, respectively. Consequently, the current detection apparatus is downsized and has high current detection accuracy.

13 Claims, 16 Drawing Sheets

(51) Int. Cl.
    *H02M 1/00*     (2006.01)
    *H02M 7/537*     (2006.01)
    *H02P 27/06*     (2006.01)

(52) U.S. Cl.
    CPC .......... *H02M 7/537* (2013.01); *H02M 1/0009* (2021.05); *H02P 27/06* (2013.01)

(56) References Cited

U.S. PATENT DOCUMENTS

| | | | |
|---|---|---|---|
| 2005/0030018 A1* | 2/2005 | Shibahara | G01R 15/20 324/251 |
| 2014/0253109 A1* | 9/2014 | Singh | G01R 15/181 324/227 |
| 2014/0375305 A1* | 12/2014 | Kawase | H01R 13/6683 324/140 R |
| 2015/0318850 A1* | 11/2015 | Hiyama | H02M 1/08 318/400.26 |
| 2017/0131329 A1* | 5/2017 | Gorai | G01R 15/207 |

FOREIGN PATENT DOCUMENTS

| | | |
|---|---|---|
| JP | 9-506709 A | 6/1997 |
| JP | 2007-113965 A | 5/2007 |
| JP | 2008-20403 A | 1/2008 |
| JP | 2010-078537 A | 4/2010 |
| JP | 2012-154831 A | 8/2012 |
| JP | 2014-194346 A | 10/2014 |
| JP | 2015-200630 A | 11/2015 |
| JP | 2016-031293 A | 3/2016 |
| JP | 2016-065736 A | 4/2016 |
| WO | 2016/047292 A1 | 3/2016 |
| WO | 2016/203781 A1 | 12/2016 |

OTHER PUBLICATIONS

Communication dated May 6, 2021, issued by the State Intellectual Property Office of the P.R.C. in application No. 201880037477.3.
Communication dated Sep. 13, 2021, issued by the State Intellectual Property Office of the P.R.C. in application No. 201880037477.3.
Communication dated Jan. 5, 2022 from the Chinese Patent Office in Chinese Application No. 201880037477.3.

* cited by examiner

CURRENT DETECTION APPARATUS AND POWER CONVERSION APPARATUS

CROSS REFERENCE TO RELATED APPLICATIONS

This application is a National Stage of International Application No. PCT/JP2018/003376 filed Feb. 1, 2018, claiming priority based on Japanese Patent Application No. 2017-116876 filed Jun. 14, 2017.

TECHNICAL FIELD

The present invention relates to a current detection apparatus and a power conversion apparatus.

BACKGROUND ART

Japanese Patent Laying-Open No. 2016-65736 (PTL 1) discloses a current detection apparatus including a magnetic detection element that detects current flowing through a conductor, a circuit board on which the magnetic detection element is mounted, and a magnetic shield surrounding the conductor, the magnetic detection element, and the circuit board.

CITATION LIST

Patent Literature

PTL 1: Japanese Patent Laying-Open No. 2016-65736

SUMMARY OF INVENTION

Technical Problem

However, the current detection apparatus disclosed in PTL 1 has a large size. The present invention has been made in view of the above problem, and an object of the present invention is to provide a compact current detection apparatus having high current detection accuracy. Another object of the present invention is to provide a power conversion apparatus including a compact current detection apparatus having high current detection accuracy.

Solution to Problem

According to one aspect of the present invention, a current detection apparatus includes a circuit board, one or more magnetic field detection elements, and one or more magnetic shields. The circuit board includes a first main surface, a second main surface on an opposite side to the first main surface, and a side surface connected to the first main surface and the second main surface. The circuit board includes one or more protrusions. The one or more protrusions protrude from a plurality of side surface portions adjacent to the one or more protrusions of the side surface, respectively. The one or more magnetic field detection elements are mounted on the first main surface. The one or more magnetic field detection elements are respectively mounted on the one or more protrusions. The one or more magnetic field detection elements are respectively configured to detect magnetic fields generated by currents flowing through one or more conductive members. The one or more conductive members extend in a first direction intersecting with the first main surface. The one or more conductive members are respectively opposed to leading end portions of the one or more protrusions. The one or more magnetic shields are respectively disposed opposite to the one or more protrusions. The one or more magnetic shields each include one or more first plate portions, one or more second plate portions, and one or more third plate portions. The one or more second plate portions are respectively opposed to the one or more first plate portions. The one or more third plate portions respectively connect the one or more first plate portions and the one or more second plate portions. The one or more first plate portions, the one or more second plate portions, and the one or more third plate portions are opposed to the side surface of the one or more protrusions. In planar view of the first main surface, the one or more protrusions, the one or more magnetic field detection elements, and the one or more conductive members are respectively surrounded by the one or more magnetic shields.

According to another aspect of the present invention, a power conversion apparatus includes the current detection apparatus of the present invention and one or more power modules. The one or more power modules each include a semiconductor switching element. The one or more power modules are respectively connected to the one or more conductive members.

Advantageous Effects of Invention

In the current detection apparatus of the present invention, the one or more first plate portions, the one or more second plate portions, and the one or more third plate portions of the one or more magnetic shields are opposed to the side surface of the one or more protrusions. In planar view of the first main surface, the one or more protrusions, the one or more magnetic field detection elements, and the one or more conductive members are respectively surrounded by the one or more magnetic shields. Consequently, the current detection apparatus of the present invention can be downsized. Additionally, in planar view of the first main surface, the one or more magnetic field detection elements and the one or more conductive members are respectively surrounded by the one or more magnetic shields. The current detection apparatus of the present invention has high current detection accuracy.

The present invention can provide a power conversion apparatus including a current detection apparatus that is downsized and has high current detection accuracy.

DESCRIPTION OF EMBODIMENTS

Figure 1:
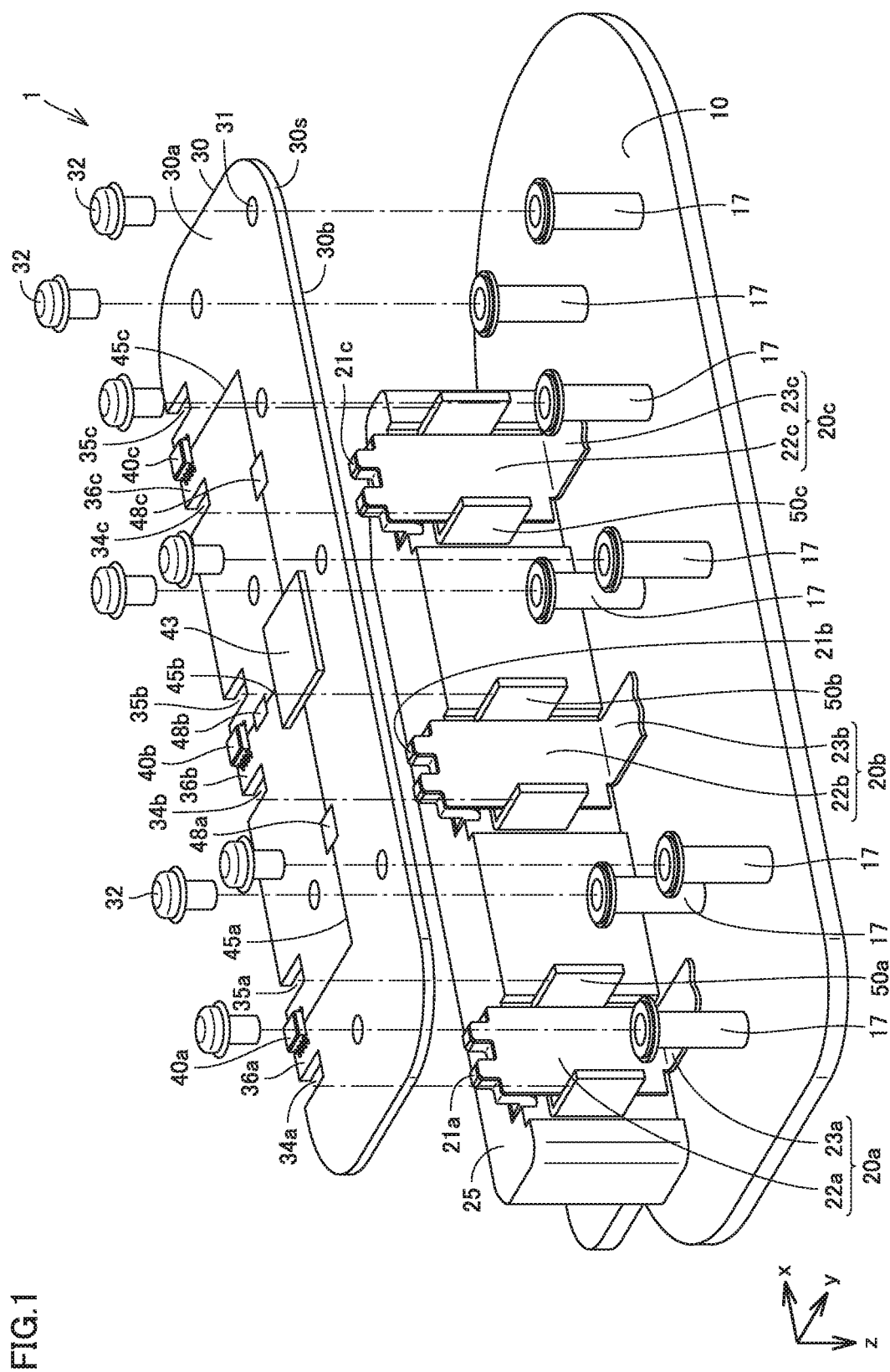
FIG. 1 is an exploded perspective view schematically illustrating a current detection apparatus according to a first embodiment of the present invention.

Hereinafter, embodiments of the present invention will be described. The same components are designated by the same reference numerals, and the overlapping description will be omitted.

First Embodiment

With reference to FIGS. 1 to 7, a current detection apparatus 1 according to a first embodiment will be described. For example, the current detection apparatus 1 of the first embodiment may be incorporated into an electric vehicle or a hybrid car to measure current flowing out of a battery of the electric vehicle or the hybrid car. For example, current detection apparatus 1 of the first embodiment may be incorporated into a machine tool to measure current flowing into a motor of the machine tool.

Current detection apparatus 1 of the first embodiment mainly includes a circuit board 30, one or more magnetic field detection elements 40a, 40b, 40c, and one or more magnetic shields 50a, 50b, 50c. Current detection apparatus 1 of the first embodiment may further include a plurality of first support members 17, a second support member 25, and a casing 10.

Circuit board 30 includes a first main surface 30a, a second main surface 30b on an opposite side to first main surface 30a, and a side surface 30s connected to first main surface 30a and second main surface 30b. In planar view of first main surface 30a, first main surface 30a extends in a second direction (for example, a y-direction) and a third direction (for example, an x-direction) orthogonal to the second direction.

Circuit board 30 includes one or more protrusions 36a, 36b, 36c. One or more protrusions 36a, 36b, 36c may be a plurality of protrusions 36a, 36b, 36c. One or more protrusions 36a, 36b, 36c protrude along the second direction (for example, the y-direction) from a plurality of side surface portions 37a, 38a, 37b, 38b, 37c, 38c adjacent to one or more protrusions 36a, 36b, 36c of side surface 30s, respectively. Specifically, protrusion 36a protrudes along the second direction (for example, the y-direction) from side surface portions 37a, 38a adjacent to protrusion 36a of side surface 30s. Protrusion 36b protrudes along the second direction (for example, the y-direction) from side surface portions 37b, 38b adjacent to protrusion 36b of side surface 30s. Protrusion 36c protrudes along the second direction (for example, the y-direction) from side surface portions 37c, 38c adjacent to protrusion 36c of side surface 30s.

Figure 2:
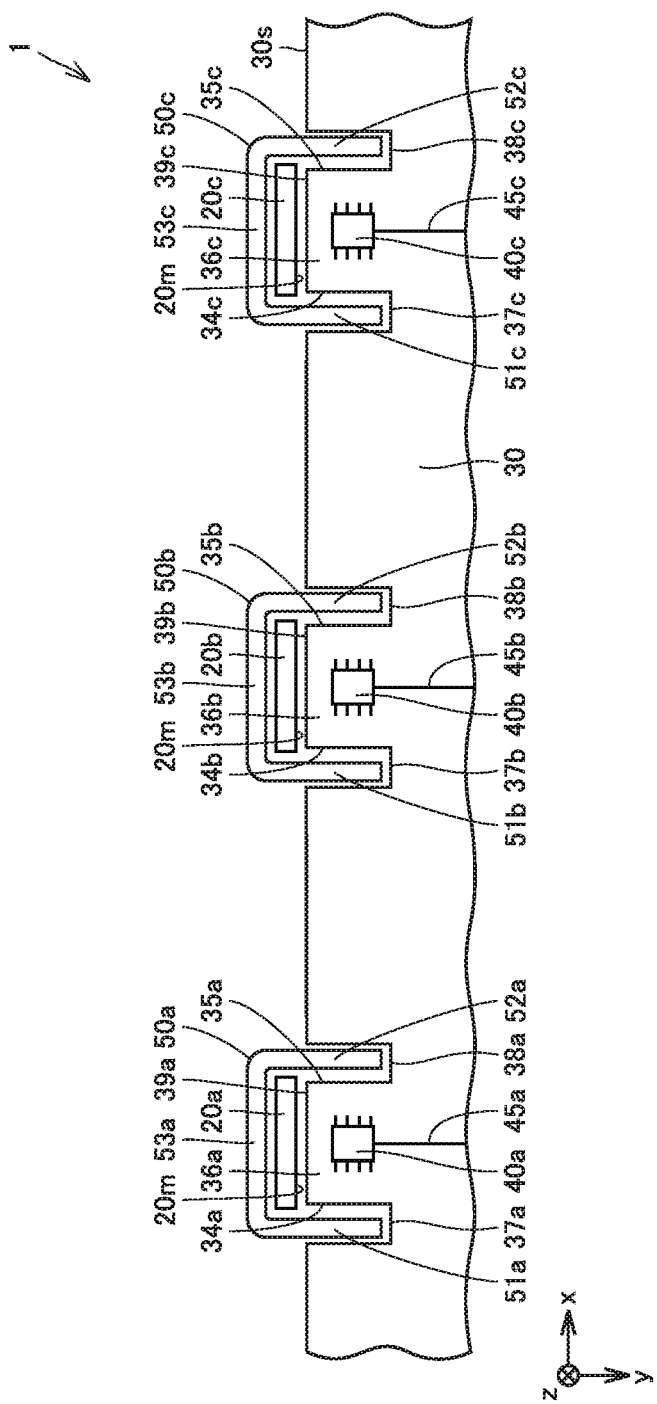
FIG. 2 is a partially enlarged plan view schematically illustrating the current detection apparatus according to the first embodiment of the present invention.
Figure 3:
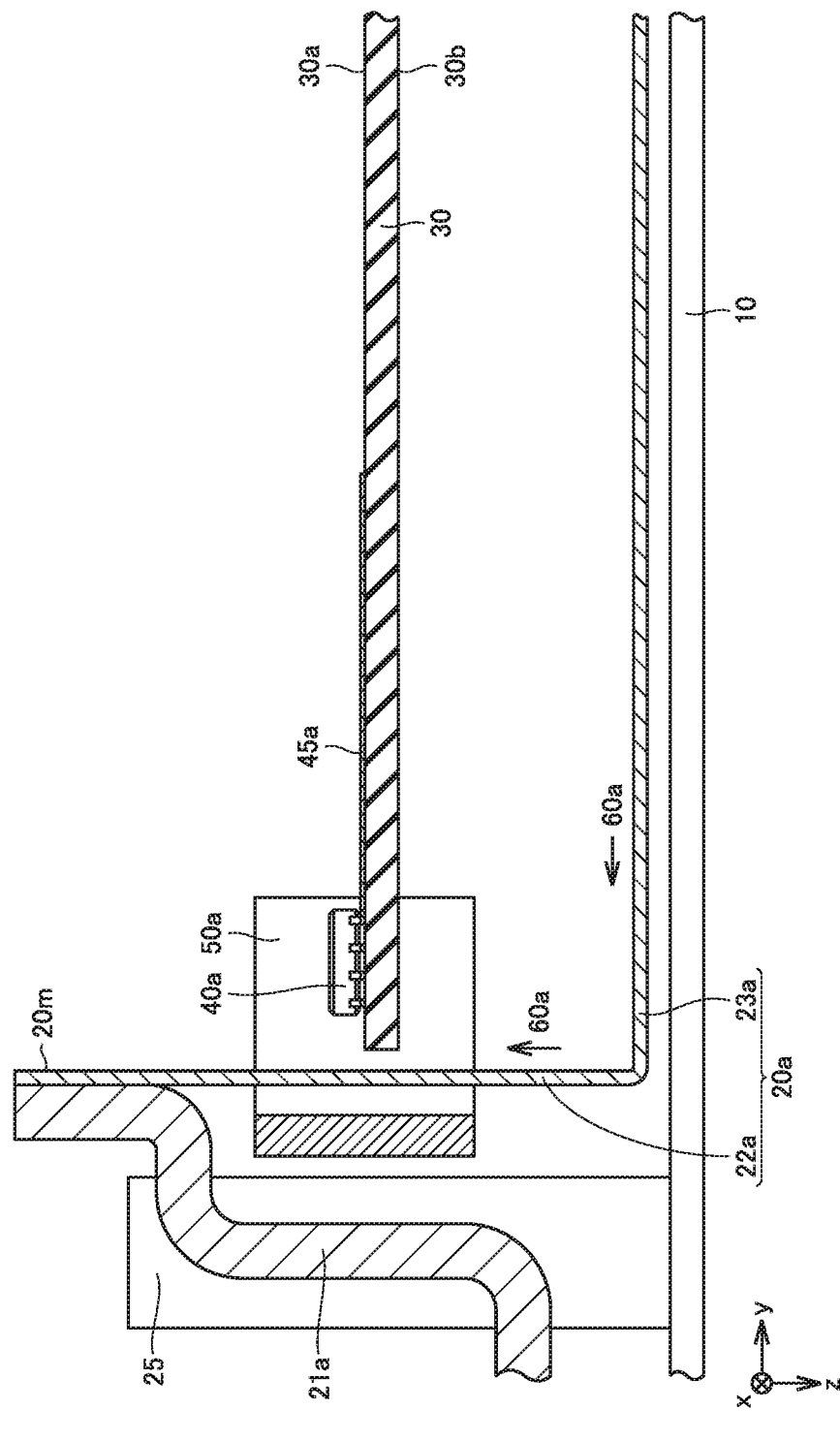
FIG. 3 is a partially sectional view schematically illustrating the current detection apparatus according to the first embodiment of the present invention.
Figure 4:
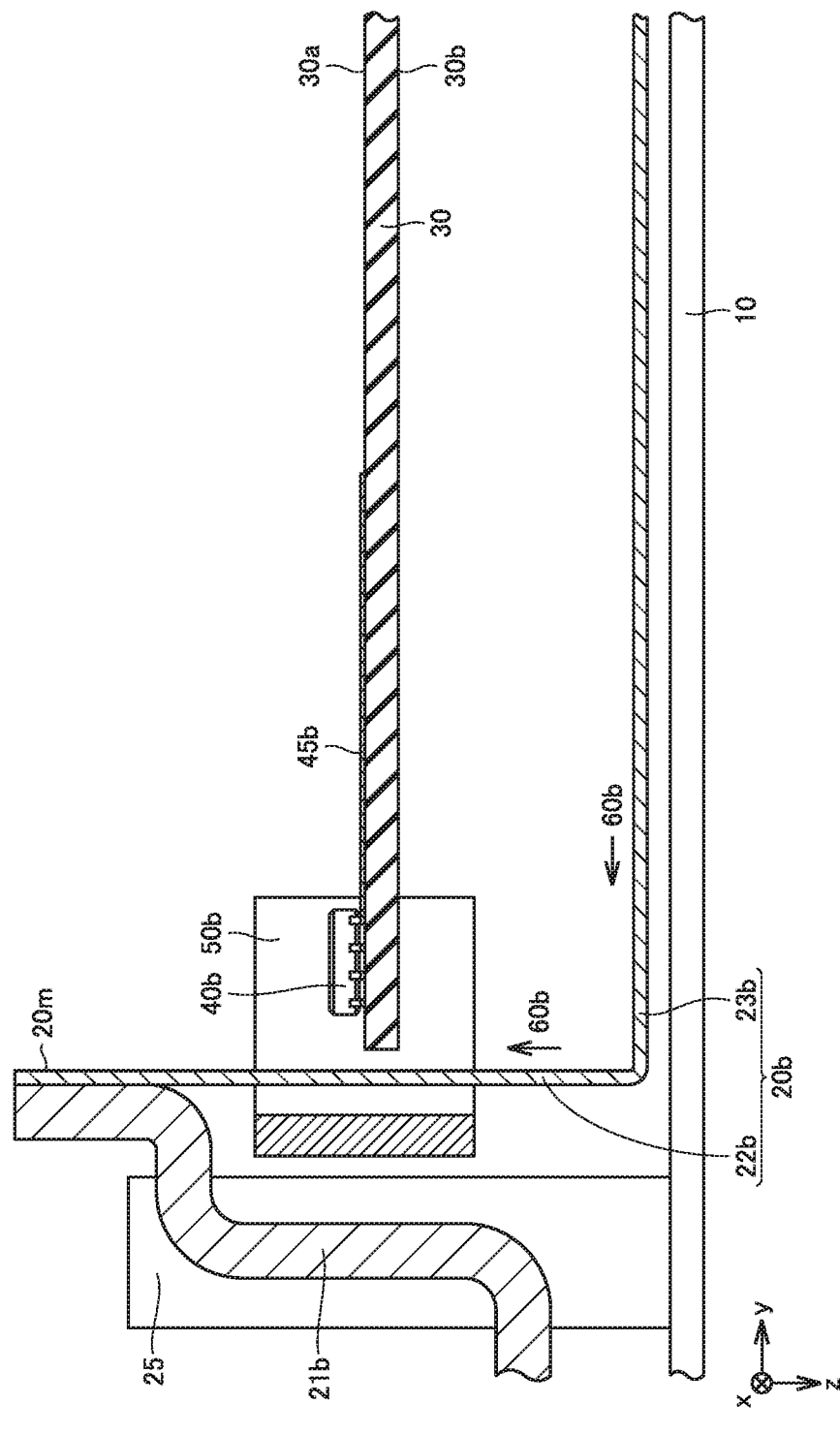
FIG. 4 is a partially sectional view schematically illustrating the current detection apparatus according to the first embodiment of the present invention.
Figure 5:
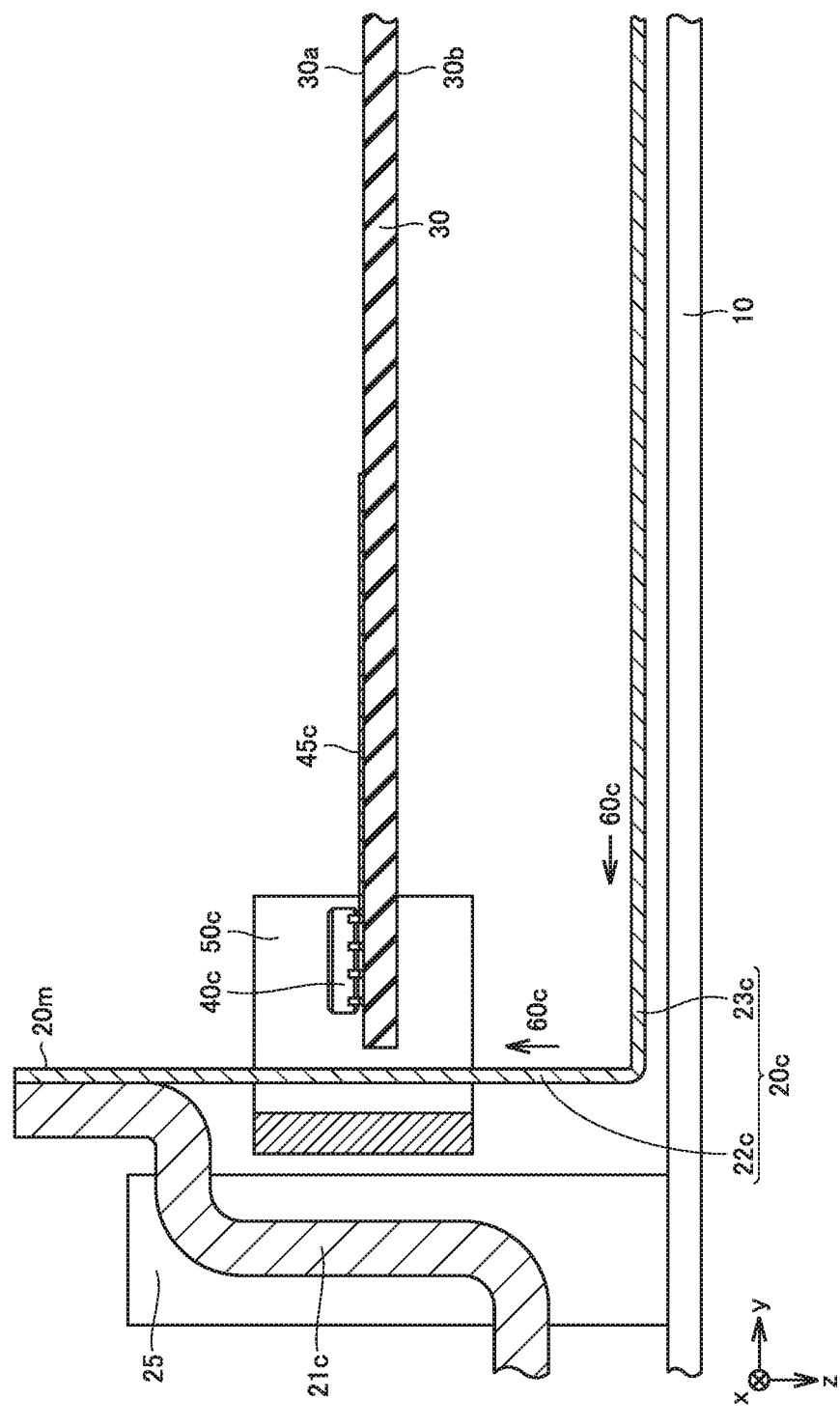
FIG. 5 is a partially sectional view schematically illustrating the current detection apparatus according to the first embodiment of the present invention.

A plurality of slits 34a, 35a, 34b, 35b, 34c, 35c may be formed in side surface 30s of circuit board 30. One or more protrusions 36a, 36b, 36c are provided between the plurality of slits 34a, 35a, 34b, 35b, 34c, 35c, respectively. As illustrated in FIGS. 1 and 2, protrusion 36a may be provided between a pair of slits 34a, 35a each of which has a narrow width, protrusion 36b may be provided between a pair of slits 34b, 35b each of which has a narrow width, and protrusion 36c may be provided between a pair of slits 34c, 35c each of which has a narrow width. As illustrated in FIGS. 1 and 2, two slits 35a, 34b may be formed between two adjacent protrusions 36a, 36b, and two slits 35b, 34c may be formed between two adjacent protrusions 36b, 36c.

Figure 6:
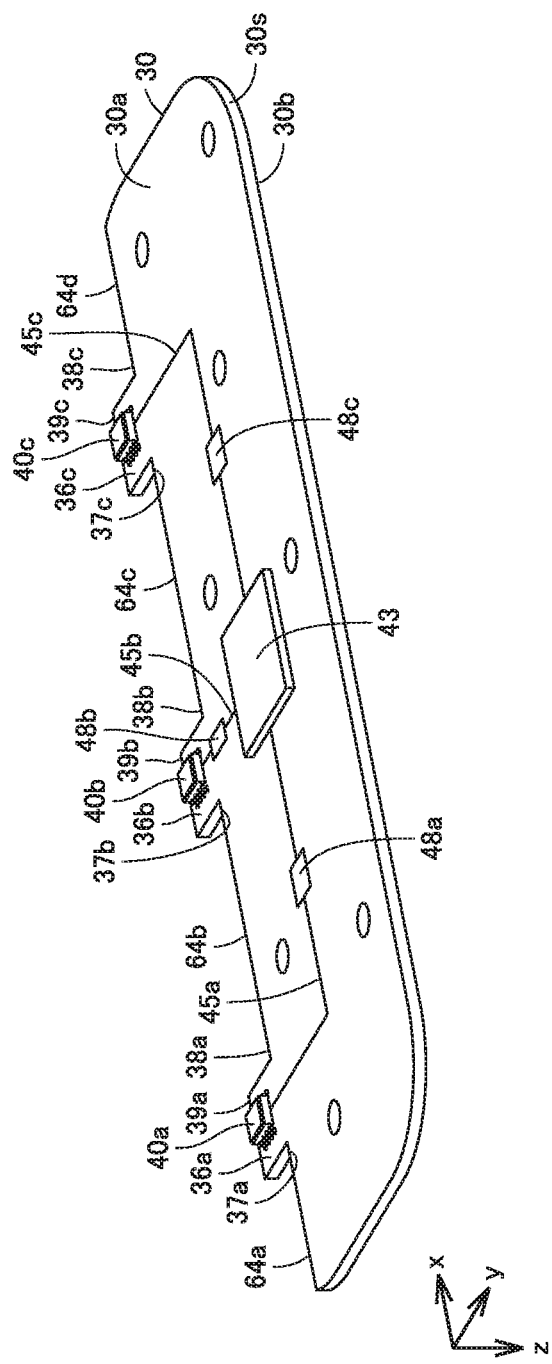
FIG. 6 is a perspective view schematically illustrating a circuit board included in a current detection apparatus according to a modification of the first embodiment of the present invention.

As illustrated in FIG. 6, protrusion 36a may be provided between a pair of slits 64a, 64b each of which has a wide width, protrusion 36b may be provided between a pair of slits 64b, 64c each of which has a wide width, and protrusion 36c may be provided between a pair of slits 64c, 64d each of which has a wide width. As illustrated in FIG. 6, one slit 64b may be formed between two adjacent protrusions 36a, 36b, and one slit 64c may be formed between two adjacent protrusions 36b, 36c.

As illustrated in FIG. 1, circuit board 30 may include a first controller 43. First controller 43 is electrically connected to magnetic field detection elements 40a, 40b, 40c. First controller 43 is electrically connected to one or more magnetic field detection elements 40a, 40b, 40c through one or more wirings 45a, 45b, 45c of circuit board 30. Specifically, first controller 43 is electrically connected to magnetic field detection element 40a through wiring 45a. First controller 43 is electrically connected to magnetic field detection element 40b through wiring 45b. First controller 43 is electrically connected to magnetic field detection element 40c through wiring 45c.

First controller 43 may include a power supply for operating current detection apparatus 1. For example, first controller 43 may control gains of one or more magnetic field detection elements 40a, 40b, 40c by adjusting voltage or current applied to each of one or more magnetic field detection elements 40a, 40b, 40c. First controller 43 may calculate currents 60a, 60b, 60c flowing through one or more conductive members 20a, 20b, 20c from magnetic fields detected by one or more magnetic field detection elements 40a, 40b, 40c, respectively. First controller 43 may receive output signals from one or more magnetic field detection elements 40a, 40b, and 40c, and control other electronic instruments (for example, power module 12a, 12b, 12c illustrated in FIG. 16) or other controllers (for example, second controllers 80a, 80b, 80c illustrated in FIGS. 15 and 16) according to the output signals.

Circuit board 30 may include one or more impedance matching components 48a, 48b, 48c. For example, one or more impedance matching components 48a, 48b, 48c may be one of a resistor, a capacitor, and an inductor. One or more impedance matching components 48a, 48b, 48c are disposed between first controller 43 and the plurality of magnetic field detection elements 40a, 40b, 40c. Specifically, impedance matching component 48a is disposed between first controller 43 and magnetic field detection element 40a. Impedance matching component 48b is disposed between first controller 43 and magnetic field detection element 40b. Impedance matching component 48c is disposed between first controller 43 and magnetic field detection element 40c.

One or more impedance matching components 48a, 48b, 48c match impedance between each of the plurality of magnetic field detection elements 40a, 40b, 40c and first controller 43 by adjusting at least one of resistance, capacitance, and inductance in an electrical path between each of the plurality of magnetic field detection elements 40a, 40b, 40c and first controller 43. One or more impedance matching components 48a, 48b, 48c reduce a variation in transient characteristic in the electrical path between each of the plurality of magnetic field detection elements 40a, 40b, 40c and first controller 43. For example, one or more impedance matching components 48a, 48b, 48c reduce rounding of a waveform of a signal output from each of the plurality of magnetic field detection elements 40a, 40b, 40c and a variation in phase of the signal. Current detection apparatus 1 of the first embodiment can accurately detect currents 60a, 60b, 60c (see FIGS. 3 to 5) flowing through one or more conductive members 20a, 20b, 20c.

One or more magnetic field detection elements 40a, 40b, 40c are mounted on first main surface 30a. One or more magnetic field detection elements 40a, 40b, 40c may be a plurality of magnetic field detection elements 40a, 40b, 40c. One or more magnetic field detection elements 40a, 40b, and 40c are not particularly limited, but may be, for example, a semiconductor element having a Hall effect or a magnetoresistive element. One or more magnetic field detection elements 40a, 40b, 40c are mounted on one or more protrusions 36a, 36b, 36c, respectively. One or more magnetic field detection elements 40a, 40b, 40c are configured to detect the magnetic fields generated by currents 60a, 60b, 60c flowing through one or more conductive members 20a, 20b, 20c, respectively. Specifically, magnetic field detection element 40a is configured to detect the magnetic field generated by current 60a flowing through conductive member 20a. Magnetic field detection element 40b is configured to detect the magnetic field generated by current 60b flowing through conductive member 20b. Magnetic field detection element 40c is configured to detect the magnetic field generated by current 60c flowing through conductive member 20c.

One or more conductive members 20a, 20b, 20c extend along a first direction (for example, a z-direction) intersecting with first main surface 30a. Specifically, one or more conductive members 20a, 20b, 20c extend along the first direction (for example, the z-direction) parallel to a normal to first main surface 30a. One or more conductive members 20a, 20b, 20c may be a plurality of conductive members 20a, 20b, 20c. One or more conductive members 20a, 20b, 20c are opposed to leading end portions 39a, 39b, 39c of one or more protrusions 36a, 36b, 36c, respectively. One or more conductive members 20a, 20b, 20c may have a plate shape. Each of one or more conductive members 20a, 20b, 20c may have one or more main surfaces 20m. One or more main surfaces 20m may face side surface 30s of one or more protrusions 36a, 36b, 36c. One or more main surfaces 20m may face leading end portions 39a, 39b, 39c of one or more protrusions 36a, 36b, 36c, respectively. One or more conductive members 20a, 20b, 20c may be made of a metallic material such as copper or a copper alloy.

As illustrated in FIGS. 1, and 3 to 5, one or more conductive members 20a, 20b, 20c may include one or more first conductive portions 22a, 22b, 22c extending along the first direction (for example, the z-direction) and one or more second conductive portions 23a, 23b, 23c extending along the second direction (for example, the y-direction), respectively. Each of one or more conductive members 20a, 20b, 20c may have an L-shape. One or more second conductive portions 23a, 23b, 23c are connected to one or more first conductive portions 22a, 22b, 22c, respectively. One or more first conductive portions 22a, 22b, 22c and one or more second conductive portions 23a, 23b, 23c may be formed by bending one or more conductive members 20a, 20b, 20c. One or more second conductive portions 23a, 23b, 23c may be conductors different from one or more first conductive portions 22a, 22b, 22c, respectively. One or more second conductive portions 23a, 23b, 23c may be connected to one or more first conductive portions 22a, 22b, 22c by soldering or welding, respectively. Currents 60a, 60b, 60c flowing through one or more conductive members 20a, 20b, 20c may flow from one or more second conductive portions 23a, 23b, 23c to one or more first conductive portions 22a, 22b, 22c, respectively (see FIGS. 3 to 5), or may flow from one or more first conductive portions 22a, 22b, 22c to one or more second conductive portions 23a, 23b, 23c, respectively.

In planar view of first main surface 30a, one or more magnetic field detection elements 40a, 40b, 40c may overlap one or more second conductive portions 23a, 23b, 23c, respectively. For this reason, the direction of the magnetic fields formed in one or more magnetic field detection elements 40a, 40b, 40c by one or more second conductive portions 23a, 23b, 23c is substantially equal to the direction of the magnetic fields formed in one or more magnetic field detection elements 40a, 40b, 40c by one or more first conductive portions 22a, 22b, 22c, respectively. The magnetic fields formed by one or more first conductive portions 22a, 22b, 22c and the magnetic fields formed by one or more second conductive portions 23a, 23b, 23c are intensified in one or more magnetic field detection elements 40a, 40b, 40c, respectively. Current detection apparatus 1 of the first embodiment can accurately detect currents 60a, 60b, 60c flowing through one or more conductive members 20a, 20b, 20c.

In planar view of first main surface 30a, one or more magnetic field detection elements 40a, 40b, 40c are separated from one or more conductive members 20a, 20b, 20c in the second direction (for example, the y-direction), respectively. Each of one or more magnetic field detection elements 40a, 40b, 40c has first magnetic field sensitivity along the second direction (for example, the y-direction) and second magnetic field sensitivity along a third direction (for example, the x-direction). The second magnetic field sensitivity may be greater than the first magnetic field sensitivity. For this reason, one (for example, magnetic field detection element 40b) of one or more magnetic field detection elements 40a, 40b, 40c has high magnetic field sensitivity to the magnetic field generated by the current (for example, current 60b) flowing through one (for example, conductive member 20b) of one or more conductive members 20a, 20b, 20c corresponding to one (for example, magnetic field detection element 40b) of one or more magnetic field detection elements 40a, 40b, 40c, and one (for example, magnetic field detection element 40b) of one or more magnetic field detection elements 40a, 40b, 40c has low magnetic field sensitivity to the magnetic fields generated by the currents (for example, currents 60s, 60c) flowing through other conductive members (for example, conductive members 20a, 20c).

Specifically, in magnetic field detection element 40b, the direction of the magnetic field generated by current 60b flowing through conductive member 20b is mainly the third direction (for example, the x-direction). On the other hand, in magnetic field detection element 40b, the direction of the magnetic fields generated by currents 60a, 60c flowing through other conductive members 20a, 20c are mainly the second direction (for example, the y-direction). Because the second magnetic field sensitivity of magnetic field detection element 40b is greater than the first magnetic field sensitivity of magnetic field detection element 40b, magnetic field detection element 40b has relatively high sensitivity to the magnetic field generated by current 60b flowing through conductive member 20b, and has relatively low sensitivity to the magnetic fields generated by currents 60a, 60c flowing through other conductive members 20a, 20c. The same as magnetic field detection element 40b applies to magnetic field detection elements 40a, 40c. Consequently, current detection apparatus 1 of the first embodiment can accurately detect currents 60a, 60b, and 60c flowing through one or more conductive members 20a, 20b, 20c.

One or more magnetic shields 50a, 50b, 50c are disposed opposite to one or more protrusions 36a, 36b, 36c, respectively. One or more magnetic shields 50a, 50b, 50c may be a plurality of magnetic shields 50a, 50b, 50c. One or more magnetic shields 50a, 50b, 50c may be made of a magnetic material. One or more magnetic shields 50a, 50b, 50c block a disturbance magnetic field and an electromagnetic noise to prevent the disturbance magnetic field and the electromagnetic noise from leaking out to one or more magnetic field detection elements 40a, 40b, 40c. For example, one (for example, magnetic shield 50b) of one or more magnetic shields 50a, 50b, 50c corresponding to one (for example, magnetic field detection element 40b) of one or more magnetic field detection elements 40a, 40b, 40c blocks most of the magnetic fields generated by currents 60a, 60c flowing through other conductive members (for example, conductive members 20a, 20c) except for one (for example, conductive member 20b) of one or more conductive members 20a, 20b, 20c corresponding to one (for example, magnetic field detection element 40b) of one or more magnetic field detection elements 40a, 40b, 40c.

One or more magnetic shields 50a, 50b, 50c can close the magnetic fields generated by currents 60a, 60b, 60c flowing through one or more conductive members 20a, 20b, 20c, and concentrate the magnetic fields in one or more magnetic field detection elements 40a, 40b, 40c, respectively. Specifically, magnetic shield 50a can close the magnetic field generated by current 60a flowing through conductive member 20a, and concentrate the magnetic field in magnetic field detection element 40a. Magnetic shield 50b can close the magnetic field generated by current 60b flowing through conductive member 20b, and concentrate the magnetic field in magnetic field detection element 40b. Magnetic shield 50c can close the magnetic field generated by current 60c flowing through conductive member 20c, and concentrate the magnetic field in magnetic field detection element 40c. Consequently, current detection apparatus 1 of the first embodiment can accurately detect currents 60a, 60b, and 60c flowing through one or more conductive members 20a, 20b, 20c.

One or more magnetic shields 50a, 50b, 50c include one or more first plate portions 51a, 51b, 51c, one or more second plate portions 52a, 52b, 52c, and one or more third plate portions 53a, 53b, 53c, respectively. One or more second plate portions 52a, 52b, 52c are opposed to one or more first plate portions 51a, 51b, 51c, respectively. One or more third plate portions 53a, 53b, 53c connect one or more first plate portions 51a, 51b, 51c and one or more second plate portions 52a, 52b, 52c, respectively. Specifically, magnetic shield 50a includes first plate portion 51a, second plate portion 52a opposed to first plate portion 51a, and third plate portion 53a connecting first plate portion 51a and second plate portion 52a. Magnetic shield 50b includes first plate portion 51b, second plate portion 52b opposed to first plate portion Mb, and third plate portion 53b connecting first plate portion 51b and second plate portion 52b. Magnetic shield 50c includes first plate portion 51c, second plate portion 52c opposed to first plate portion 51c, and third plate portion 53c connecting first plate portion 51c and second plate portion 52c.

One or more first plate portions 51a, 51b, 51c, one or more second plate portions 52a, 52b, 52c, and one or more third plate portions 53a, 53b, 53c are opposed to side surface 30s of one or more protrusions 36a, 36b, 36c, respectively. Specifically, first plate portion 51a, second plate portion 52a, and third plate portion 53a are opposed to side surface 30s of protrusion 36a. First plate portion 51b, second plate portion 52b, and third plate portion 53b are opposed to side surface 30s of protrusion 36b. First plate portion 51c, second plate portion 52c, and third plate portion 53c are opposed to side surface 30s of protrusion 36c.

As illustrated in FIG. 2, in planar view of first main surface 30a, one or more protrusions 36a, 36b, 36c, one or more magnetic field detection elements 40a, 40b, 40c, and one or more conductive members 20a, 20b, 20c are surrounded by one or more magnetic shields 50a, 50b, 50c, respectively. Specifically, protrusion 36a, magnetic field detection element 40a, and conductive member 20a are surrounded by magnetic shield 50a in planar view of first main surface 30a. Protrusion 36b, magnetic field detection element 40b, and conductive member 20b are surrounded by magnetic shield 50b in planar view of first main surface 30a. Protrusion 36c, magnetic field detection element 40c, and conductive member 20c are surrounded by magnetic shield 50c in planar view of first main surface 30a.

As illustrated in FIG. 1, a plurality of first support members 17 support at least one of first main surface 30a and second main surface 30b. In the first embodiment, the plurality of first support members 17 support second main surface 30b. For example, each of the plurality of first support members 17 may have a columnar shape. At least one of first main surface 30a and second main surface 30b of circuit board 30 is fixed to the plurality of first support members 17. In the first embodiment, second main surface 30b is fixed to the plurality of first support members 17. Consequently, even if vibration is applied to current detection apparatus 1 of the first embodiment, circuit board 30 is prevented from being displaced in the second direction (for example, the y-direction) and the third direction (for example, the x-direction). For example, when current detection apparatus 1 of the first embodiment is incorporated into an automobile or a machine tool, the vibration may be generated due to an engine or a motor.

Figure 7:
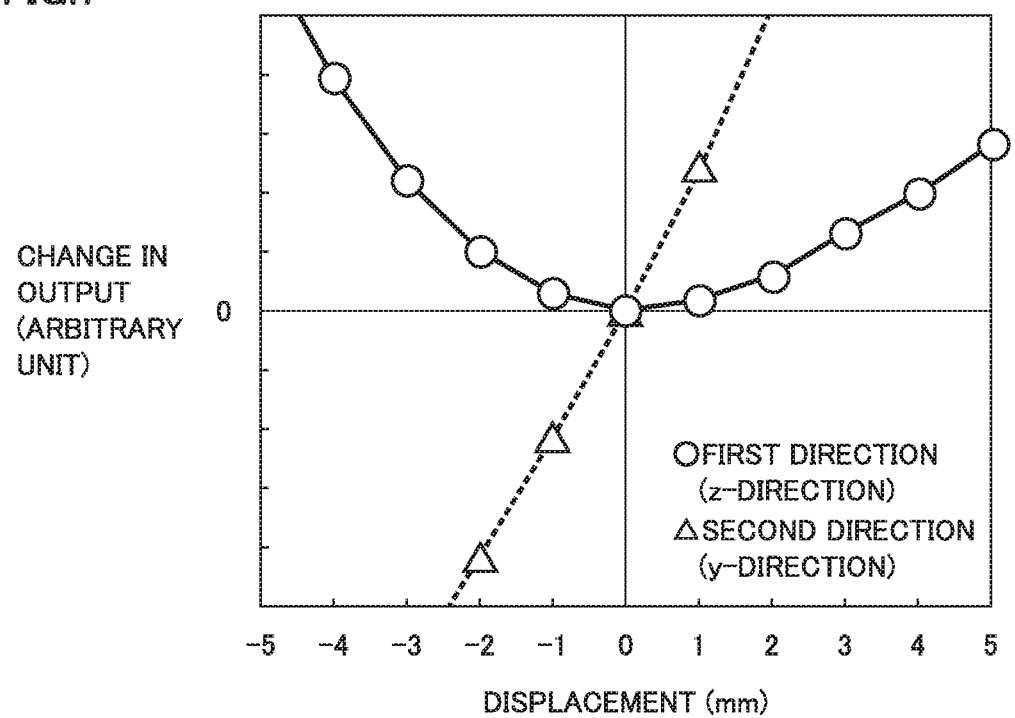
FIG. 7 is a graph illustrating a change in output from a magnetic field detection element when the magnetic field detection element is deviated in the current detection apparatus according to the first embodiment of the present invention.

As illustrated in FIG. 7, a change in output from magnetic field detection elements 40a, 40b, 40c when magnetic field detection elements 40a, 40b, 40c are displaced in the second direction (for example, the y-direction) is larger than a change in output from magnetic field detection elements 40a, 40b, 40c when magnetic field detection elements 40a, 40b, 40c are displaced in the first direction (for example, the z-direction). In current detection apparatus 1 of the first embodiment, circuit board 30 is prevented from being displaced in the second direction (for example, the y-direction) and the third direction (for example, the x-direction). Consequently, even if the vibration is applied to current detection apparatus 1 of the first embodiment to vibrate circuit board 30 in the first direction (for example, the z-direction), current detection apparatus 1 of the first embodiment can accurately detect currents 60a, 60b, 60c flowing through one or more conductive members 20a, 20b, 20c.

Because one or more conductive members 20a, 20b, 20c extend along the first direction (for example, the z-direction), a first component along the first direction (for example, the z-direction) of the magnetic fields generated by current 60a, 60b, 60c flowing through one or more conductive members 20a, 20b, 20c is much smaller than a second component along the second direction (for example, the y-direction) of the magnetic fields and a third component along the direction of (for example, the x-direction) of the magnetic fields. Even if the vibration is applied to current detection apparatus 1 to vibrate circuit board 30 in the first direction (for example, the z-direction), the direction in which circuit board 30 vibrates is substantially matched with the direction in which a change in output from magnetic field detection elements 40a, 40b, 40c when magnetic field detection elements 40a, 40b, 40c are displaced is small. For this reason, as illustrated in FIG. 7, it is considered that the change in output from magnetic field detection elements 40a, 40b, 40c when magnetic field detection elements 40a, 40b, 40c are displaced in the first direction (for example, the z-direction) is larger than the change in output from magnetic field detection elements 40a, 40b, 40c when magnetic field detection elements 40a, 40b, 40c are displaced in the second direction (for example, the y-direction).

The plurality of first support members 17 are fixed to casing 10. The plurality of first support members 17 may be integrated into casing 10. Circuit board 30 may be fixed to casing 10 with the plurality of first support members 17 interposed therebetween. Specifically, circuit board 30 is fixed to the plurality of first support members 17 using a plurality of screws 32. A plurality of through holes 31 in which the plurality of screws 32 are inserted are made in circuit board 30.

As illustrated in FIGS. 1, and 3 to 5, second support member 25 supports one or more conductive members 20a, 20b, 20c. Specifically, one or more conductive members 20a, 20b, 20c are connected to one or more bus bars 21a, 21b, 21c, respectively. Second support member 25 supports one or more bus bars 21a, 21b, 21c. One or more bus bars 21a, 21b, 21c are attached to second support member 25. Thus, one or more conductive members 20a, 20b, 20c are supported by second support member 25 with one or more bus bars 21a, 21b, 21c interposed therebetween, respectively. One or more bus bars 21a, 21b, 21c may be made of a metallic material such as copper or a copper alloy. Second support member 25 is fixed to casing 10. For example, second support member 25 may be a terminal block. Second support member 25 may be integrated into casing 10.

One or more magnetic shields 50a, 50b, 50c may be supported by second support member 25. One or more magnetic shields 50a, 50b, 50c may be attached to second support member 25. One or more magnetic shields 50a, 50b, 50c may be attached to one or more conductive members 20a, 20b, 20c, respectively. Specifically, one or more magnetic shields 50a, 50b, 50c may be attached to one or more conductive members 20a, 20b, 20c using screws (not illustrated), respectively. One or more magnetic shields 50a, 50b, 50c may be attached to second support member 25 with one or more conductive members 20a, 20b, 20c interposed therebetween, respectively.

The advantageous effects of current detection apparatus 1 of the first embodiment will be described.

Current detection apparatus 1 of the first embodiment includes circuit board 30, one or more magnetic field detection elements 40a, 40b, 40c, and one or more magnetic shields 50a, 50b, 50c. Circuit board 30 includes a first main surface 30a, a second main surface 30b on an opposite side to first main surface 30a, and a side surface 30s connected to first main surface 30a and second main surface 30b. Circuit board 30 includes one or more protrusions 36a, 36b, 36c. One or more protrusions 36a, 36b, 36c protrude from the plurality of side surface portions 37a, 38a, 37b, 38b, 37c, 38c adjacent to one or more protrusions 36a, 36b, 36c of side surface 30s, respectively. One or more magnetic field detection elements 40a, 40b, 40c are mounted on first main surface 30a. One or more magnetic field detection elements 40a, 40b, 40c are mounted on one or more protrusions 36a, 36b, 36c, respectively. One or more magnetic field detection elements 40a, 40b, 40c are configured to detect the magnetic fields generated by currents 60a, 60b, 60c flowing through one or more conductive members 20a, 20b, 20c, respectively. One or more conductive members 20a, 20b, 20c extend along the first direction intersecting with first main surface 30a. One or more conductive members 20a, 20b, 20c are opposed to leading end portions 39a, 39b, 39c of one or more protrusions 36a, 36b, 36c, respectively.

One or more magnetic shields 50a, 50b, 50c are disposed opposite to one or more protrusions 36a, 36b, 36c, respectively. One or more magnetic shields 50a, 50b, 50c include one or more first plate portions 51a, 51b, 51c, one or more second plate portions 52a, 52b, 52c, and one or more third plate portions 53a, 53b, 53c, respectively. One or more second plate portions 52a, 52b, 52c are opposed to one or more first plate portions 51a, 51b, 51c, respectively. One or more third plate portions 53a, 53b, 53c connect one or more first plate portions 51a, 51b, 51c and one or more second plate portions 52a, 52b, 52c, respectively. One or more first plate portions 51a, 51b, 51c, one or more second plate portions 52a, 52b, 52c and one or more third plate portions 53a, 53b, 53c are opposed to side surface 30s of one or more protrusions 36a, 36b, 36c. In planar view of first main surface 30a, one or more protrusions 36a, 36b, 36c, one or more magnetic field detection elements 40a, 40b, 40c, and one or more conductive members 20a, 20b, 20c are surrounded by one or more magnetic shields 50a, 50b, 50c, respectively.

In current detection apparatus 1 of the first embodiment, one or more first plate portions 51a, 51b, 51c, one or more second plate portions 52a, 52b, 52c, and one or more third plate portions 53a, 53b, 53c of one or more magnetic shields 50a, 50b, 50c are opposed to side surface 30s of one or more protrusions 36a, 36b, 36c, respectively. In planar view of first main surface 30a, one or more protrusions 36a, 36b, 36c, one or more magnetic field detection elements 40a, 40b, 40c, and one or more conductive members 20a, 20b, 20c are surrounded by one or more magnetic shields 50a, 50b, 50c, respectively. Consequently, current detection apparatus 1 of the first embodiment can be downsized.

In planar view of first main surface 30a, one or more magnetic field detection elements 40a, 40b, 40c and one or more conductive members 20a, 20b, 20c are surrounded by one or more magnetic shields 50a, 50b, 50c, respectively. One or more magnetic shields 50a, 50b, 50c shield the disturbance magnetic field and the electromagnetic noise to prevent the disturbance magnetic field and the electromagnetic noise from leaking out to one or more magnetic field detection elements 40a, 40b, 40c, respectively. Further, one or more magnetic shields 50a, 50b, 50c can close the magnetic fields generated by currents 60a, 60b, 60c flowing through one or more conductive members 20a, 20b, 20c, and concentrate the magnetic fields in one or more magnetic field detection elements 40a, 40b, 40c, respectively. For this reason, current detection apparatus 1 of the first embodiment has high current detection accuracy.

In current detection apparatus 1 of the first embodiment, one or more protrusions 36a, 36b, 36c may be a plurality of protrusions 36a, 36b, 36c, one or more conductive members 20a, 20b, 20c may be a plurality of conductive members 20a, 20b, 20c, one or more magnetic field detection elements 40a, 40b, 40c may be a plurality of magnetic field detection elements 40a, 40b and 40c, and one or more magnetic shields 50a, 50b, 50c may be a plurality of magnetic shields 50a, 50b, 50c. In current detection apparatus 1 of the first embodiment, the plurality of magnetic field detection elements 40a, 40b, 40c are provided on one circuit board 30, and the plurality of conductive members 20a, 20b, 20c and the plurality of magnetic shields 50a, 50b, 50c are disposed adjacent to one circuit board 30. Consequently, current detection apparatus 1 of the first embodiment can be downsized.

In current detection apparatus 1 of the first embodiment, circuit board 30 includes the controller (first controller 43). The controller (first controller 43) is electrically connected to the plurality of magnetic field detection elements 40a, 40b, 40c. In current detection apparatus 1 of the first embodiment, the controller (first controller 43) that controls the plurality of magnetic field detection elements 40a, 40b, 40c is provided on one circuit board 30. Consequently, current detection apparatus 1 of the first embodiment can be downsized.

In current detection apparatus 1 of the first embodiment, circuit board 30 includes one or more impedance matching components 48a, 48b, 48c. One or more impedance matching components 48a, 48b, 48c are disposed between the controller (first controller 43) and the plurality of magnetic field detection elements 40a, 40b, 40c. One or more impedance matching components 48a, 48b, 48c reduce the variation in transient characteristic in the electrical path between the plurality of magnetic field detection elements 40a, 40b, 40c and the controller (first controller 43). For this reason, current detection apparatus 1 of the first embodiment has high current detection accuracy.

In current detection apparatus 1 of the first embodiment, in planar view of first main surface 30a, first main surface 30a extends in the second direction (for example, the y-direction) and the third direction (for example, the x-direction) orthogonal to the second direction. In planar view of first main surface 30a, one or more magnetic field detection elements 40a, 40b, 40c are separated from one or more conductive members 20a, 20b, 20c in the second direction (for example, the y-direction), respectively. Each of one or more magnetic field detection elements 40a, 40b, 40c has first magnetic field sensitivity along the second direction (for example, the y-direction) and second magnetic field sensitivity along a third direction (for example, the x-direction). The second magnetic field sensitivity is greater than the first magnetic field sensitivity.

For this reason, one (for example, magnetic field detection element 40b) of one or more magnetic field detection elements 40a, 40b, 40c has high magnetic field sensitivity to the magnetic field generated by the current (for example, current 60b) flowing through one (for example, conductive member 20b) of one or more conductive members 20a, 20b, 20c corresponding to one (for example, magnetic field detection element 40b) of one or more magnetic field detection elements 40a, 40b, 40c, and one (for example, magnetic field detection element 40b) of one or more magnetic field detection elements 40a, 40b, 40c has low magnetic field sensitivity to the magnetic fields generated by the currents (for example, currents 60s, 60c) flowing through other conductive members (for example, conductive members 20a, 20c). Current detection apparatus 1 of the first embodiment has high current detection accuracy.

In current detection apparatus 1 of the first embodiment, one or more conductive members 20a, 20b, 20c include one or more first conductive portions 22a, 22b, 22c extend along the first direction (for example, the z-direction) and one or more second conductive portions 23a, 23b, 23c extending along the second direction (for example, the y-direction), respectively. One or more second conductive portions 23a, 23b, 23c are connected to one or more first conductive portions 22a, 22b, 22c, respectively. In planar view of first main surface 30a, one or more magnetic field detection elements 40a, 40b, 40c overlap one or more second conductive portions 23a, 23b, 23c, respectively. For this reason, the direction of the magnetic fields formed in one or more magnetic field detection elements 40a, 40b, 40c by one or more second conductive portions 23a, 23b, 23c is substantially equal to the direction of the magnetic fields formed in one or more magnetic field detection elements 40a, 40b, 40c by one or more first conductive portions 22a, 22b, 22c, respectively. The magnetic fields formed by one or more first conductive portions 22a, 22b, 22c and the magnetic fields formed by one or more second conductive portions 23a, 23b, 23c are intensified in one or more magnetic field detection elements 40a, 40b, 40c, respectively. Current detection apparatus 1 of the first embodiment has high current detection accuracy.

Current detection apparatus 1 of the first embodiment further includes the plurality of first support members 17 to which at least one of first main surface 30a and second main surface 30b is fixed, and casing 10 to which the plurality of first support members 17 are fixed. Circuit board 30 is fixed to casing 10 with the plurality of first support members 17 interposed therebetween. Consequently, even if the vibration is applied to current detection apparatus 1, circuit board 30 is prevented from being displaced in first main surface 30a and second main surface 30b. When the vibration is applied to current detection apparatus 1, circuit board 30 vibrates in the first direction (for example, the z-direction). However, the direction in which circuit board 30 vibrates is substantially matched with the direction in which the change in output from magnetic field detection elements 40a, 40b, 40c when magnetic field detection elements 40a, 40b, 40c are displaced is small. Current detection apparatus 1 of the first embodiment has high current detection accuracy.

Second Embodiment

Figure 8:
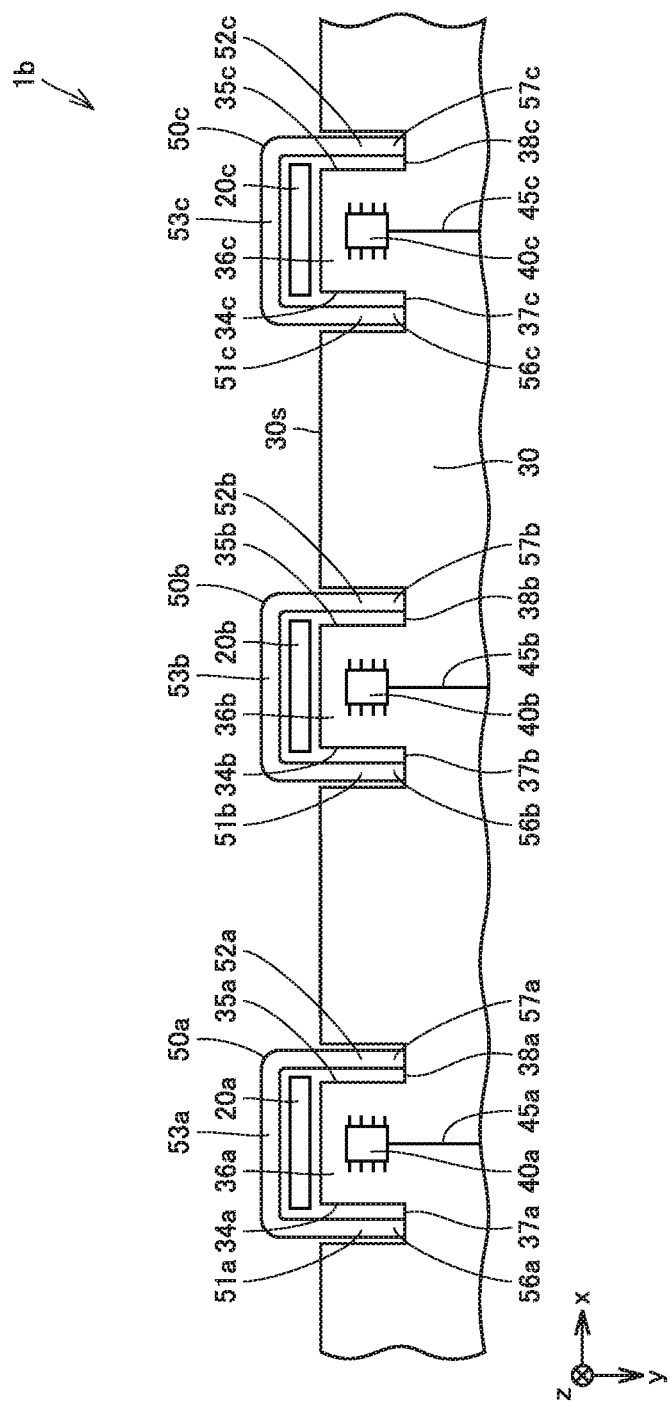
FIG. 8 is a partially enlarged plan view schematically illustrating a current detection apparatus according to a second embodiment of the present invention.

With reference to FIG. 8, a current detection apparatus 1b according to a second embodiment will be described. Current detection apparatus 1b of the second embodiment has the same configuration as current detection apparatus 1 of the first embodiment, but differs mainly from current detection apparatus 1 in the following points.

In current detection apparatus 1b of the second embodiment, one or more first plate portions 51a, 51b, 51c include one or more first ends 56a, 56b, 56c, respectively. One or more second plate portions 52a, 52b, 52c include one or more second ends 57a, 57b, 57c, respectively. One or more first ends 56a, 56b, 56c and one or more second ends 57a, 57b, 57c abut on the plurality of side surface portions 37a, 38a, 37b, 38b, 37c, 38c. Specifically, as illustrated in FIG. 8, first end 56a of magnetic shield 50a abuts on side surface portion 37a. Second end 57a of magnetic shield 50a abuts on side surface portion 38a. First end 56b of first plate portion 51b of magnetic shield 50b and second end 57b of second plate portion 52b of magnetic shield 50b abut on side surface portion 37b and side surface portion 38b, respectively. First end 56c of first plate portion 51c of magnetic shield 50c and second end 57c of second plate portion 52c of magnetic shield 50c abut on side surface portion 37c and side surface portion 38c, respectively.

In addition to the advantageous effects of current detection apparatus 1 of the first embodiment, current detection apparatus 1b of the second embodiment has the following advantageous effects.

In current detection apparatus 1b of the second embodiment, one or more first plate portions 51a, 51b, 51c include one or more first ends 56a, 56b, 56c, respectively. One or more second plate portions 52a, 52b, 52c include one or more second ends 57a, 57b, 57c, respectively. One or more first ends 56a, 56b, 56c and one or more second ends 57a, 57b, 57c abut on the plurality of side surface portions 37a, 38a, 37b, 38b, 37c, 38c. For this reason, one or more magnetic shields 50a, 50b, 50c are positioned in the second direction (for example, the y-direction) with respect to one or more magnetic field detection elements 40a, 40b, 40c, respectively. One or more magnetic shields 50a, 50b, 50c are prevented from being displaced in the second direction (for example, the y-direction) with respect to one or more magnetic field detection elements 40a, 40b, 40c, respectively. Current detection apparatus 1b of the second embodiment has high current detection accuracy.

Third Embodiment

Figure 9:
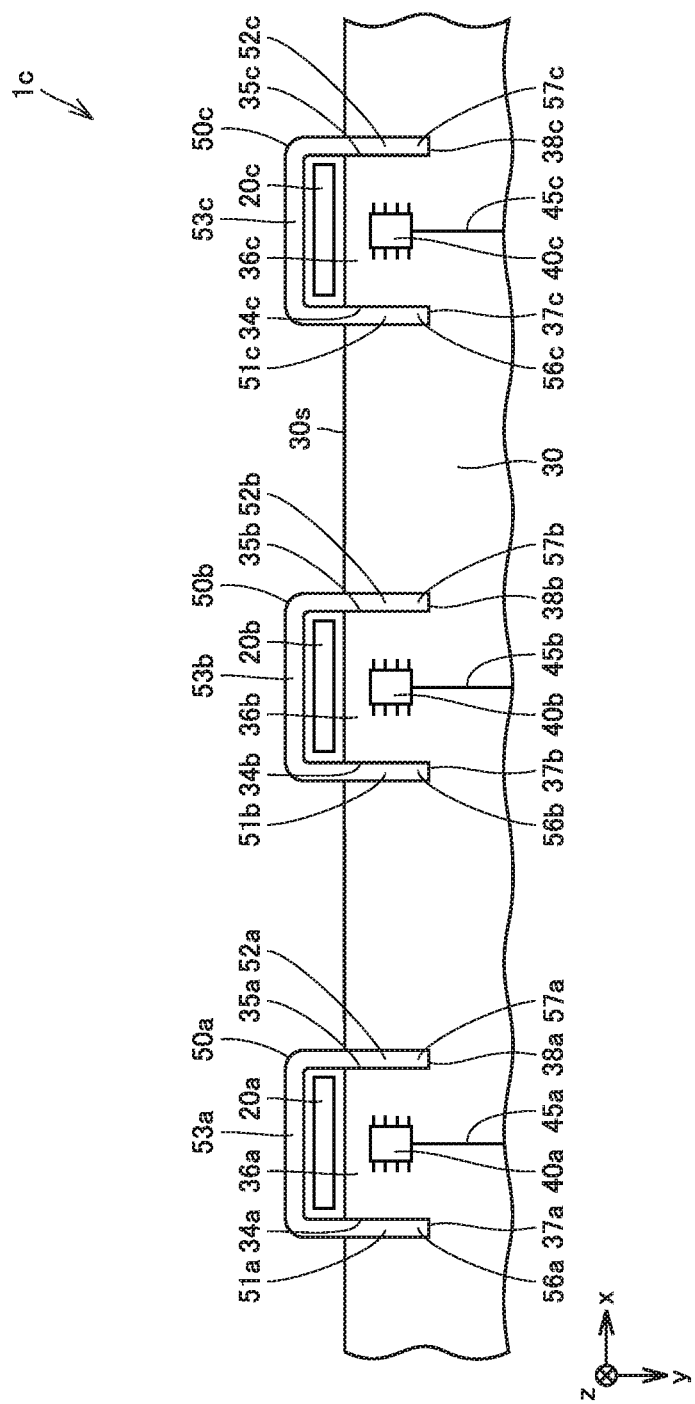
FIG. 9 is a partially enlarged plan view schematically illustrating a current detection apparatus according to a third embodiment of the present invention.
Figure 10:
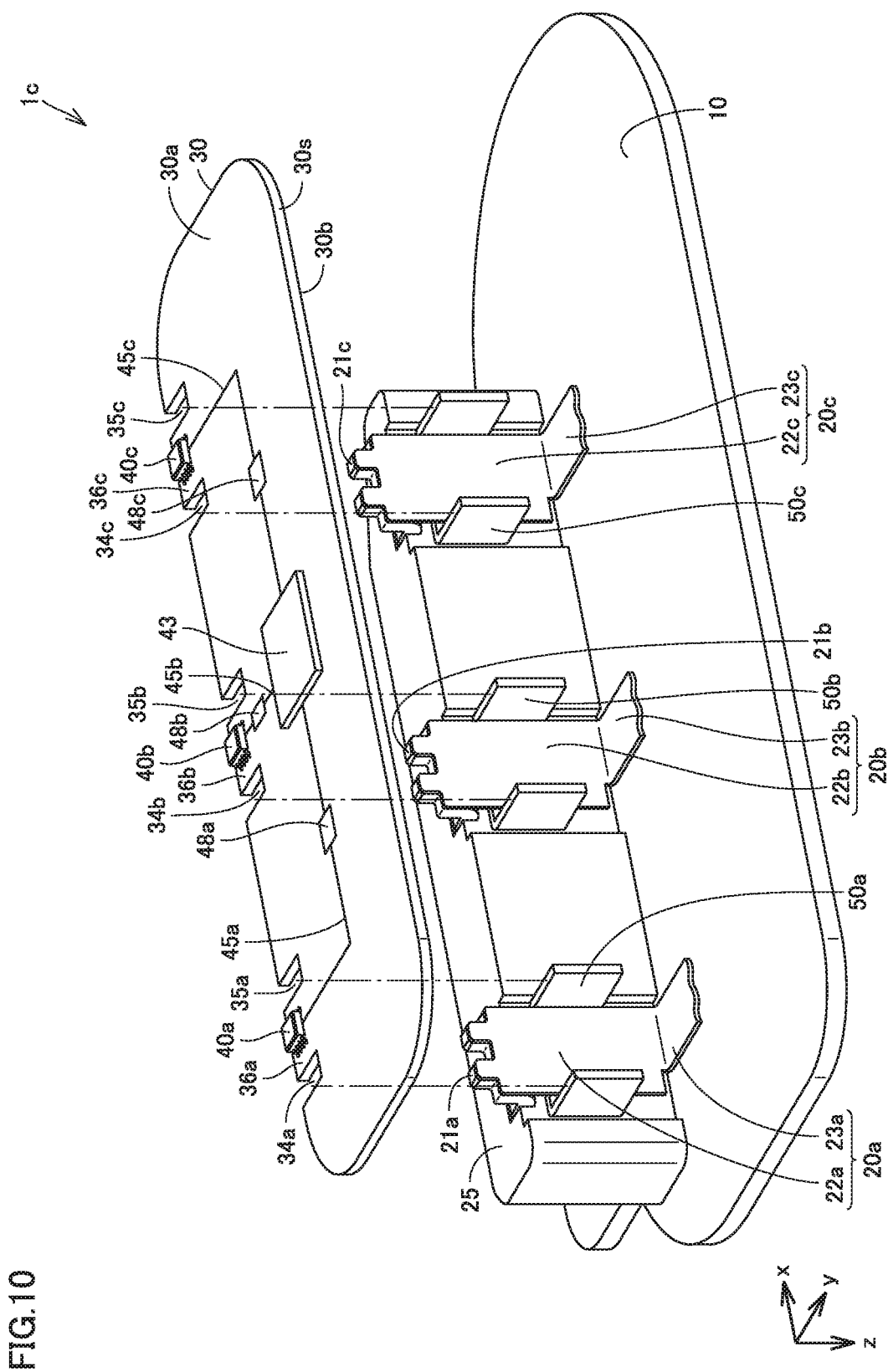
FIG. 10 is an exploded perspective view schematically illustrating the current detection apparatus according to the third embodiment of the present invention.
Figure 11:
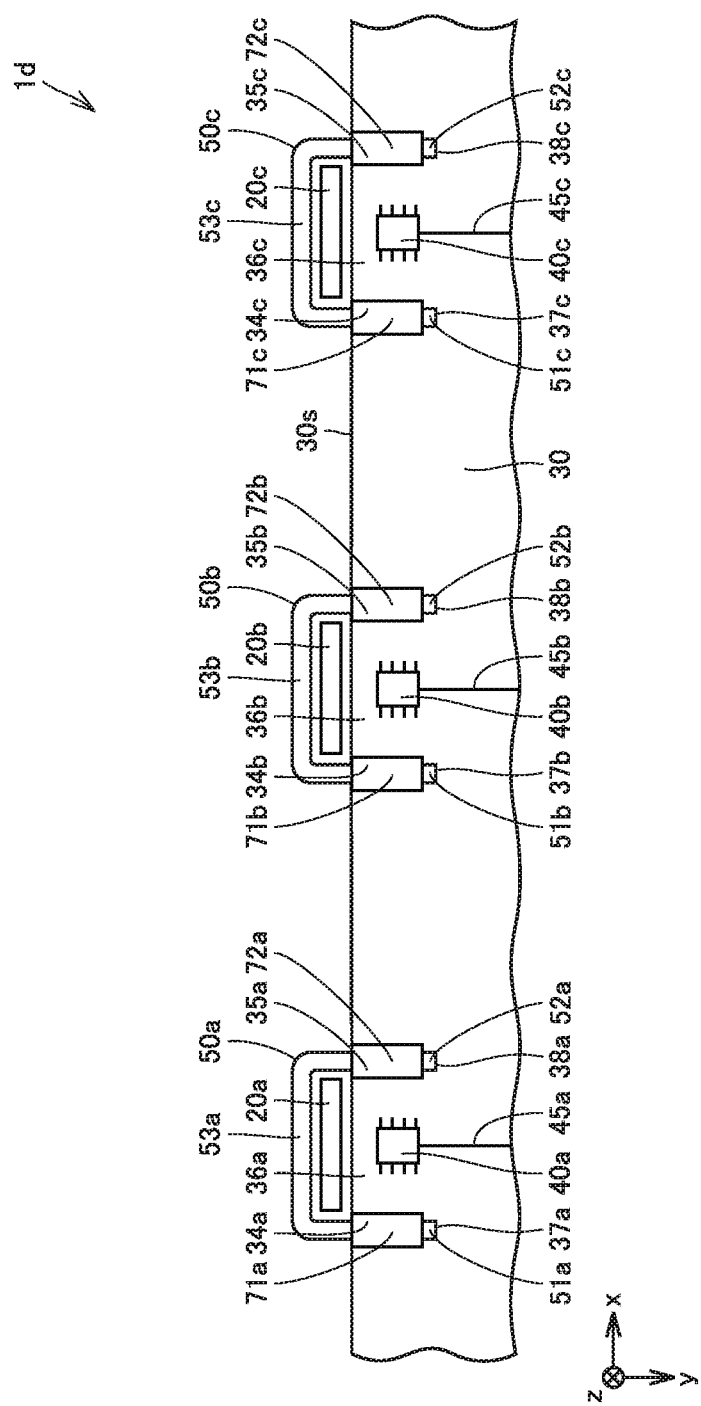
FIG. 11 is a partially enlarged plan view schematically illustrating a current detection apparatus according to a fourth embodiment of the present invention.

With reference to FIGS. 9 and 10, a current detection apparatus 1c according to a third embodiment will be described. Current detection apparatus 1c of the present embodiment has the same configuration as current detection apparatus 1b of the second embodiment, but differs mainly from current detection apparatus 1b in the following points.

In current detection apparatus 1c of the third embodiment, the plurality of slits 34a, 35a, 34b, 35b, 34c, 35c are formed in side surface 30s of circuit board 30. One or more protrusions 36a, 36b, 36c are provided between the plurality of slits 34a, 35a, 34b, 35b, 34c, 35c, respectively. One or more first plate portions 51a, 51b, 51c and one or more second plate portions 52a, 52b, 52c are press-fit into the plurality of slits 34a, 35a, 34b, 35b, 34c, 35c. Specifically, protrusion 36a is provided between slit 34a and slit 35a. First plate portion 51a and second plate portion 52a of magnetic shield 50a are press-fit into slit 34a and slit 35a, respectively. Protrusion 36b is provided between slit 34b and slit 35b. First plate portion 51b and second plate portion 52b of magnetic shield 50b are press-fit into slit 34b and slit 35b, respectively. Protrusion 36c is provided between slit 34c and slit 35c. First plate portion 51c and second plate portion 52c of magnetic shield 50c are press-fit into slit 34c and slit 35c, respectively.

As illustrated in FIG. 10, current detection apparatus 1c of the third embodiment further includes second support member 25 supporting one or more magnetic shields 50a, 50b, 50c and casing 10 to which second support member 25 is fixed. Circuit board 30 is fixed to casing 10 with one or more magnetic shields 50a, 50b, 50c and second support member 25 interposed therebetween. In current detection apparatus 1c of the third embodiment, first support member 17, the plurality of screws 32, and the plurality of through-holes 31 of the first and second embodiments may be omitted.

In addition to the advantageous effects of current detection apparatus 1b of the second embodiment, current detection apparatus 1c of the third embodiment has the following advantageous effects.

In current detection apparatus 1c of the third embodiment, the plurality of slits 34a, 35a, 34b, 35b, 34c, 35c are formed in side surface 30s of circuit board 30. One or more protrusions 36a, 36b, 36c are provided between the plurality of slits 34a, 35a, 34b, 35b, 34c, 35c, respectively. One or more first plate portions 51a, 51b, 51c and one or more second plate portions 52a, 52b, 52c are press-fit into the plurality of slits 34a, 35a, 34b, 35b, 34c, 35c. Therefore, one or more magnetic shields 50a, 50b, 50c are positioned in the second direction (for example, the y-direction) and the third direction (for example, the x-direction) with respect to one or more magnetic field detection elements 40a, 40b, 40c, respectively. One or more magnetic shields 50a, 50b, 50c are prevented from being displaced in the second direction (for example, the y-direction) and the third direction (for example, the x-direction) with respect to one or more magnetic field detecting elements 40a, 40b, 40c, respectively. Current detection apparatus 1c of the third embodiment has high current detection accuracy.

Even if the vibration is applied to current detection apparatus 1c of the third embodiment to vibrate circuit board 30 in the first direction (for example, the z-direction), one or more magnetic shields 50a, 50b, 50c vibrate in the first direction (for example, the z-direction) by following one or more protrusions 36a, 36b, 36c and one or more magnetic field detection elements 40a, 40b, 40c. The relative positions of one or more magnetic shields 50a, 50b, 50c with respect to one or more magnetic field detection elements 40a, 40b, 40c are prevented from being displaced. Current detection apparatus 1c of the third embodiment has high current detection accuracy.

Current detection apparatus 1c of the third embodiment further includes second support member 25 supporting one or more magnetic shields 50a, 50b, 50c and casing 10 to which second support member 25 is fixed. Circuit board 30 is fixed to casing 10 with one or more magnetic shields 50a, 50b, 50c and second support member 25 interposed therebetween. For this reason, first support member 17, the plurality of screws 32 and the plurality of through holes 31 of the first and second embodiments that are used to fix circuit board 30 to casing 10 can be omitted. Current detection apparatus 1c of the third embodiment can be downsized, and have a simplified structure.

Fourth Embodiment

With reference to FIGS. 11 to 14, a current detection apparatus 1d according to a fourth embodiment will be described. Current detection apparatus 1d of the fourth embodiment has the same configuration as current detection apparatus 1c of the third embodiment, but differs mainly from current detection apparatus 1c in the following points.

Current detection apparatus 1d of the fourth embodiment further includes one or more first resin members 71a, 71b, 71c and one or more second resin members 72a, 72b, 72c. For example, one or more first resin members 71a, 71b, 71c and one or more second resin members 72a, 72b, 72c may be made of a resin material such as polycarbonate, polyphenylene sulfide (PPS), or polyphenylene ether (PPE).

One or more first resin members 71a, 71b, 71c cover one or more first plate portions 51a, 51b, 51c, respectively. One or more second resin members 72a, 72b, 72c cover one or more second plate portions 52a, 52b, 52c, respectively. Specifically, first resin member 71a covers first plate portion 51a of magnetic shield 50a. First resin member 71b covers first plate portion 51b of magnetic shield 50b. First resin member 71c covers first plate portion 51c of magnetic shield 50c. Second resin member 72a covers second plate portion 52a of magnetic shield 50a. Second resin member 72b covers second plate portion 52b of magnetic shield 50b. Second resin member 72c covers second plate portion 52c of magnetic shield 50c.

The plurality of slits 34a, 35a, 34b, 35b, 34c, 35c are formed in side surface 30s of circuit board 30. One or more protrusions 36a, 36b, 36c are provided between the plurality of slits 34a, 35a, 34b, 35b, 34c, 35c, respectively. One or more first resin members 71a, 71b, 71c and one or more second resin members 72a, 72b, 72c are press-fit into the plurality of slits 34a, 35a, 34b, 35b, 34c, 35c. Specifically, first resin member 71a provided on magnetic shield 50a is press-fit into slit 34a, and second resin member 72a provided on magnetic shield 50a is press-fit into slit 35a. First resin member 71b provided on magnetic shield 50b is press-fit into slit 34b, and second resin member 72b provided on magnetic shield 50b is press-fit into slit 35b. First resin member 71c provided on magnetic shield 50c is press-fit into slit 34c, and second resin member 72c provided on magnetic shield 50c is press-fit into slit 35c.

Figure 12:
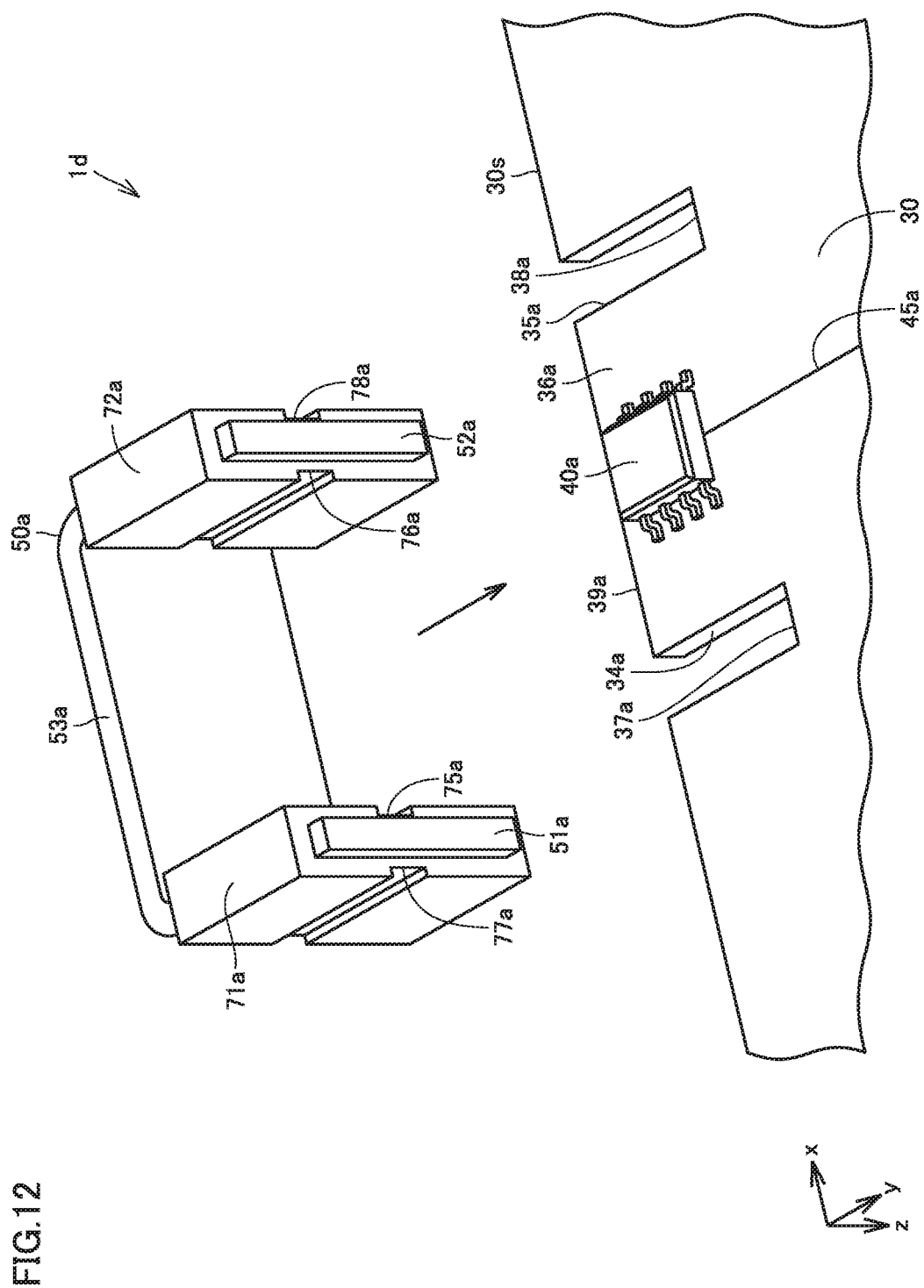
FIG. 12 is a partially enlarged exploded perspective view schematically illustrating the current detection apparatus according to the fourth embodiment of the present invention.

One or more first resin members 71a, 71b, 71c are in contact with side surface 30s, first main surface 30a, and second main surface 30b. One or more second resin members 72a, 72b, 72c are in contact with side surface 30s, first main surface 30a, and second main surface 30b. Specifically, as illustrated in FIG. 12, a groove 75a is formed in first resin member 71a, and a groove 76a is formed in second resin member 72a. Groove 75a and groove 76a are opposed to side surface 30s of protrusion 36a. A groove 77a is formed in first resin member 71a, and a groove 78a is formed in second resin member 72a. Groove 77a and groove 78a are formed on the opposite side to groove 75a and groove 76a, respectively. Grooves 77a and grooves 78a are opposed to side surface 30s of circuit board 30 on the opposite side to side surface 30s of protrusion 36a. Grooves 75a, 76a, 77a, 78a extend along the second direction (for example, the y-direction) in which slits 34a, 35a extend. Grooves 75a, 76a, 77a, 78a extend along the second direction (for example, the y-direction) in which protrusion 36a protrudes. An inner wall of groove 75a and an inner wall of groove 76a contact with first main surface 30a, second main surface 30b, and side surface 30s of protrusion 36a. Protrusion 36a is fitted in groove 75a and groove 76a. Grooves 77a and grooves 78a contact with first main surface 30a, second main surface 30b, and side surface 30s of circuit board 30. Circuit board 30 is fitted in groove 77a and groove 78a.

Figure 13:
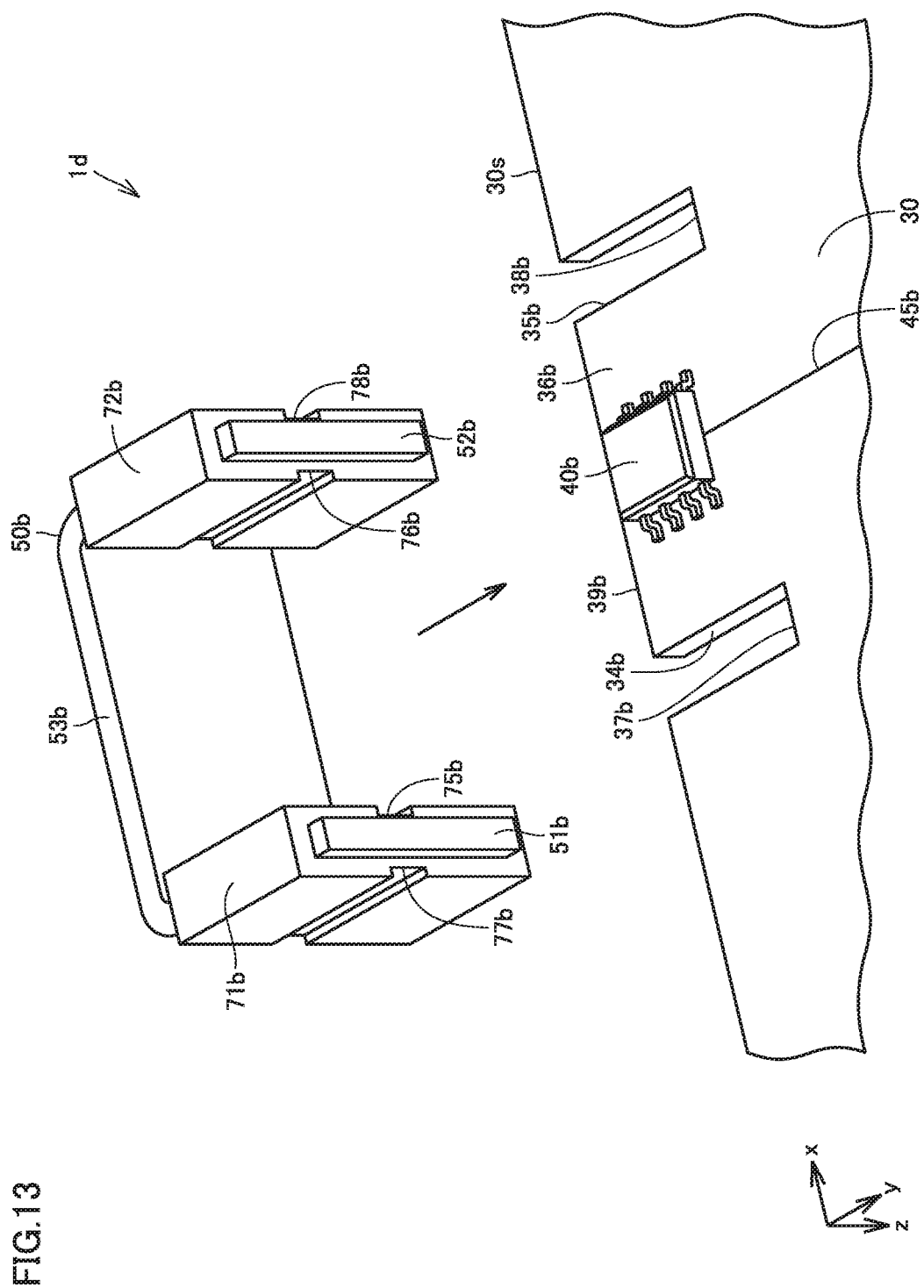
FIG. 13 is a partially enlarged exploded perspective view schematically illustrating the current detection apparatus according to the fourth embodiment of the present invention.

As illustrated in FIG. 13, a groove 75b is formed in first resin member 71b, and a groove 76b is formed in second resin member 72b. Groove 75b and groove 76b are opposed to side surface 30s of protrusion 36b. A groove 77b is formed in first resin member 71b, and a groove 78b is formed in second resin member 72b. Groove 77b and groove 78b are formed on the opposite side to groove 75b and groove 76b, respectively. Grooves 77b and grooves 78b are opposed to side surface 30s of circuit board 30 on the opposite side to side surface 30s of protrusion 36b. Grooves 75b, 76b, 77b, 78b extend along the second direction (for example, the y-direction) in which slits 34b, 35b extend. Grooves 75b, 76b, 77b, 78b extend along the second direction (for example, the y-direction) in which protrusion 36b protrudes. The inner wall of groove 75b and the inner wall of groove 76b contact with first main surface 30a, second main surface 30b, and side surface 30s of protrusion 36b. Protrusion 36b is fitted in groove 75b and groove 76b. Grooves 77b and grooves 78b contact with first main surface 30a, second main surface 30b, and side surface 30s of circuit board 30. Circuit board 30 is fitted in groove 77a and groove 78a.

Figure 14:
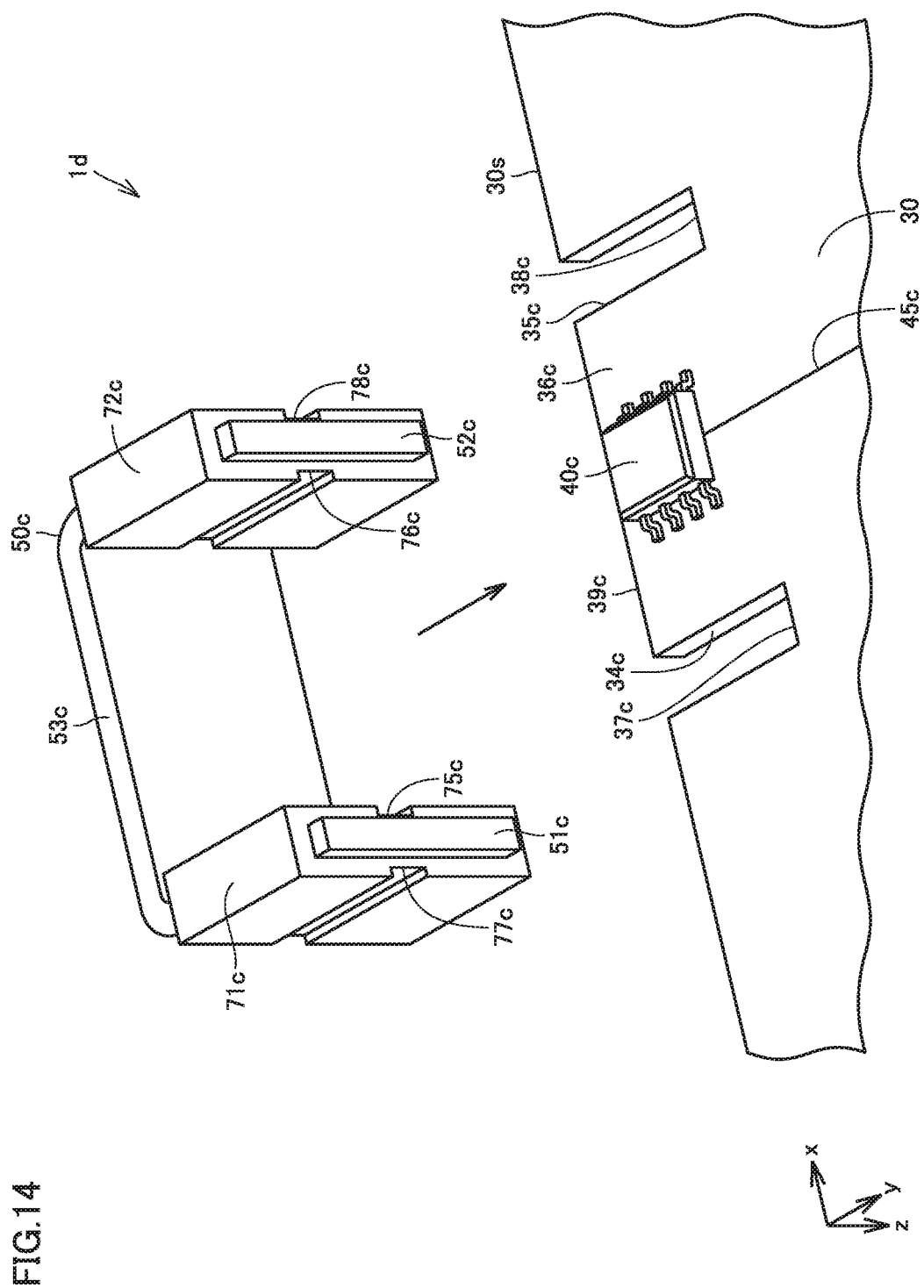
FIG. 14 is a partially enlarged exploded perspective view schematically illustrating the current detection apparatus according to the fourth embodiment of the present invention.

As illustrated in FIG. 14, a groove 75c is formed in first resin member 71c, and a groove 76c is formed in second resin member 72c. Groove 75c and groove 76c are opposed to side surface 30s of protrusion 36c. A groove 77c is formed in first resin member 71c, and a groove 78c is formed in second resin member 72c. Groove 77c and groove 78c are formed on the opposite side to groove 75c and groove 76c, respectively. Groove 77c and groove 78c are opposed to side surface 30s of circuit board 30 on the opposite side to side surface 30s of protrusion 36c. Grooves 75c, 76c, 77c, 78c extend along the second direction (for example, the y-direction) in which slits 34c, 35c extend. Grooves 75c, 76c, 77c, 78c extend along the second direction (for example, the y-direction) in which protrusion 36c protrudes. The inner wall of groove 75c and the inner wall of groove 76c are in contact with first main surface 30a, second main surface 30b, and side surface 30s of protrusion 36c. Protrusion 36c is fitted in groove 75c and groove 76c. Groove 77c and groove 78c are in contact with first main surface 30a, second main surface 30b, and side surface 30s of circuit board 30. Circuit board 30 is fitted in groove 77c and groove 78c.

In addition to the advantageous effects of current detection apparatus 1c of the third embodiment, current detection apparatus 1d of the present embodiment has the following advantageous effects.

Current detection apparatus 1d of the fourth embodiment further includes one or more first resin members 71a, 71b, 71c and one or more second resin members 72a, 72b, 72c. One or more first resin members 71a, 71b, 71c cover one or more first plate portions 51a, 51b, 51c, respectively. One or more second resin members 72a, 72b, 72c cover one or more second plate portions 52a, 52b, 52c, respectively. The plurality of slits 34a, 35a, 34b, 35b, 34c, 35c are formed in side surface 30s of circuit board 30. One or more protrusions 36a, 36b, 36c are provided between the plurality of slits 34a, 35a, 34b, 35b, 34c, 35c, respectively. One or more first resin members 71a, 71b, 71c and one or more second resin members 72a, 72b, 72c are press-fit into the plurality of slits 34a, 35a, 34b, 35b, 34c, 35c. One or more first resin members 71a, 71b, 71c are in contact with side surface 30s, first main surface 30a, and second main surface 30b. One or more second resin members 72a, 72b, 72c are in contact with side surface 30s, first main surface 30a, and second main surface 30b.

For this reason, one or more first resin members 71a, 71b, 71c and one or more second resin members 72a, 72b, 72c are in contact with circuit board 30 in a larger area. One or more magnetic shields 50a, 50b, 50c are fixed to circuit board 30 more firmly with one or more first resin members 71a, 71b, 71c and one or more second resin members 72a, 72b, 72c interposed therebetween. Current detection apparatus 1d of the fourth embodiment has high reliability and a long lifetime.

Fifth Embodiment

Figure 15:
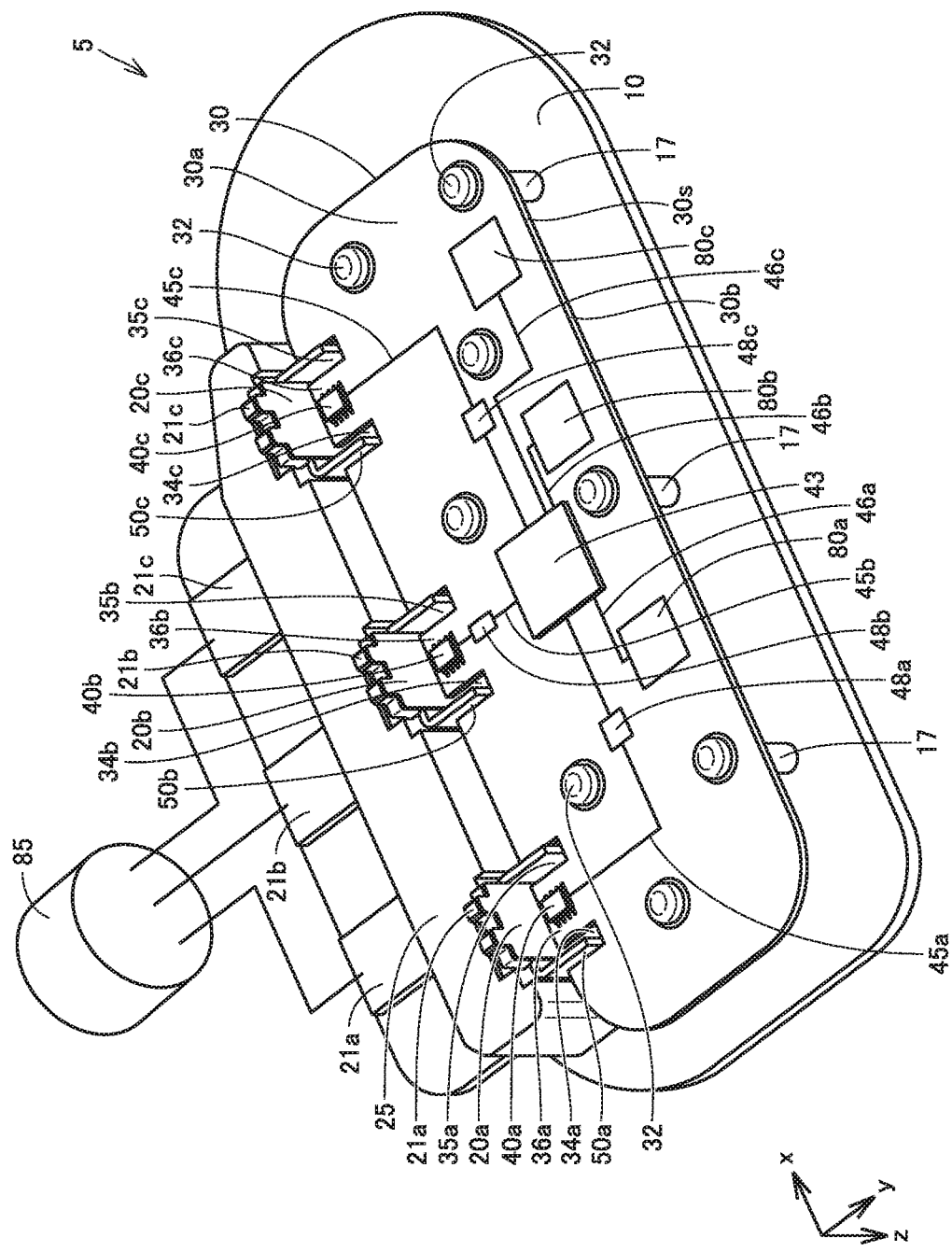
FIG. 15 is a perspective view schematically illustrating a power conversion apparatus according to a fifth embodiment of the present invention.
Figure 16:
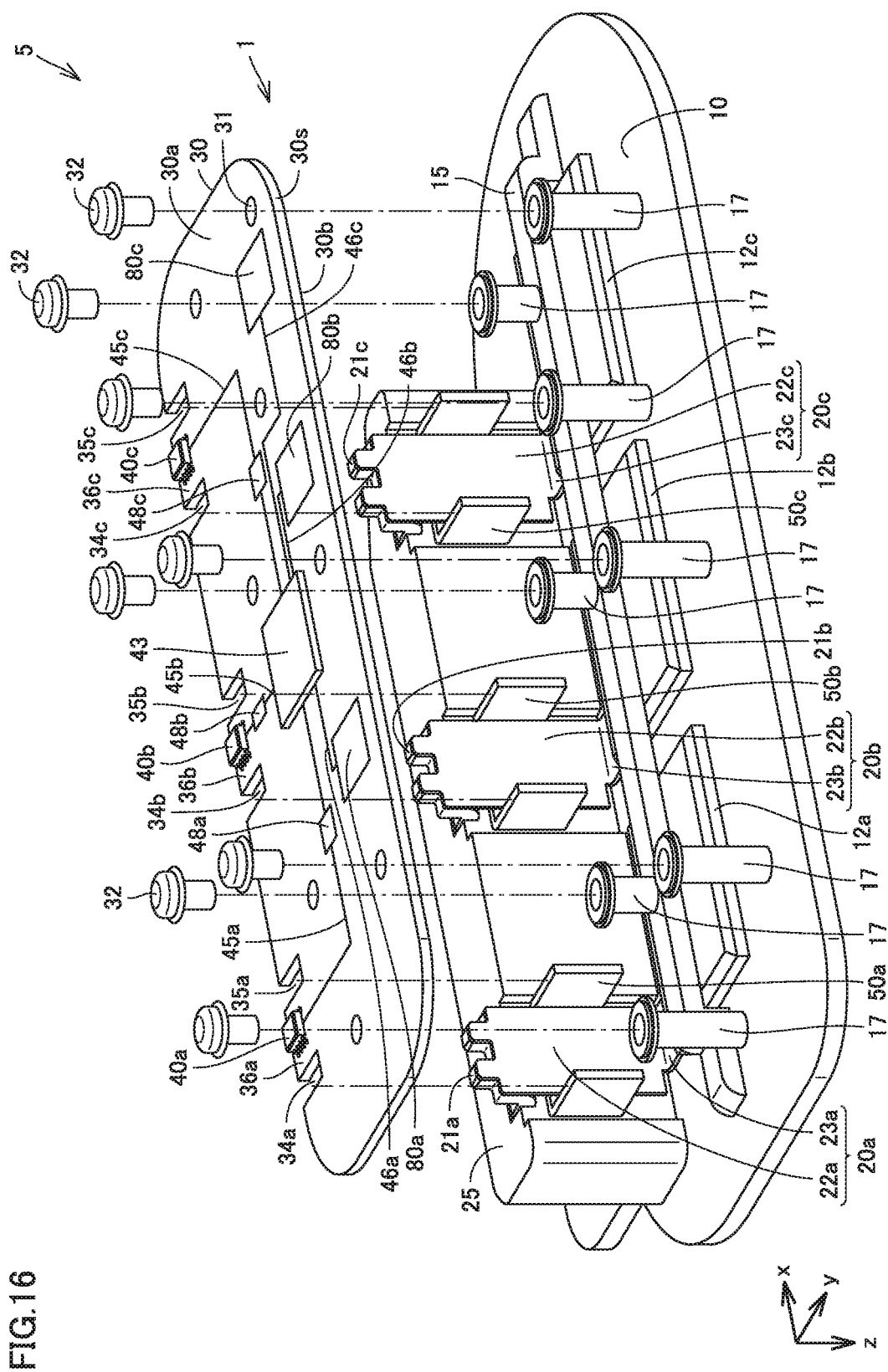
FIG. 16 is an exploded perspective view schematically illustrating the power conversion apparatus according to the fifth embodiment of the present invention.

With reference to FIGS. 15 and 16, a power conversion apparatus 5 according to a fifth embodiment will be described. Power conversion apparatus 5 of the fifth embodiment mainly includes current detection apparatus 1 of the first embodiment and power modules 12a, 12b, 12c. In the fifth embodiment, current detection apparatus 1 of the first embodiment is applied to power conversion apparatus 5. Current detection apparatus 1b, 1c, 1d of the second to forth embodiments may be applied to power conversion apparatus 5.

Each of one or more power modules 12a, 12b, 12c may include a semiconductor switching element. For example, the semiconductor switching element may be an insulated gate bipolar transistor (IGBT) or a metal oxide semiconductor field effect transistor (MOSFET). The semiconductor switching device may be formed of a semiconductor material such as silicon (Si), silicon carbide (SiC), or gallium nitride (GaN). One or more power modules 12a, 12b, 12c may be connected to one or more conductive members 20a, 20b, 20c, respectively. In the fifth embodiment, for example, current detection apparatus 1 detects the current output from each of one or more power modules 12a, 12b, 12c.

One or more power modules 12a, 12b, 12c may be pressed against casing 10 by a clamp 15 to be attached to casing 10. A part of first support member 17 may be provided in clamp 15. A part of first support member 17 may be integral with clamp 15.

Circuit board 30 may include one or more second controllers 80a, 80b, 80c. One or more second controllers 80a, 80b, 80c are electrically connected to one or more power modules 12a, 12b, 12c, respectively. One or more second controllers 80a, 80b, 80c control one or more power modules 12a, 12b, 12c, respectively. First controller 43 is electrically connected to one or more second controllers 80a, 80b, 80c. First controller 43 is electrically connected to one or more second controllers 80a, 80b, 80c through one or more wirings 46a, 46b, and 46c included in circuit board 30. Specifically, first controller 43 is electrically connected to second controller 80a through wiring 46a. First controller 43 is electrically connected to second controller 80b through wiring 46b. First controller 43 is electrically connected to second controller 80c through wiring 46c.

In power conversion apparatus 5 of the fifth embodiment, one or more magnetic shields 50a, 50b, 50c may be fixed to not first support member 17 and second support member 25, but one or more power modules 12a, 12b, 12c.

Power conversion apparatus 5 of the fifth embodiment may be connected to a load 85 such as a motor. Load 85 is not limited to a specific application, but is a motor mounted on various electric instruments. For example, load 85 may be used as a hybrid car, an electric car, a rail car, an elevator, or a motor for an air conditioner.

The advantageous effects of power conversion apparatus 5 of the fifth embodiment will be described.

Power conversion apparatus 5 of the fifth embodiment includes any one of current detection apparatus 1, 1b, 1c, 1d of the first to fourth embodiments and one or more power modules 12a, 12b, 12c. One or more power modules 12a, 12b, 12c are connected to one or more conductive members 20a, 20b, 20c, respectively. Consequently, power conversion apparatus 5 of the fifth embodiment includes current detection apparatus 1, 1b, 1c, 1d that is downsized and has high current detection accuracy.

It should be considered that the disclosed first to fifth embodiments are examples in all respects, and not restrictive. As long as there is no contradiction, at least two of the disclosed first to fifth embodiments may be combined. The scope of the present invention is defined by not the above description but the claims, and it is intended that all modifications within the meaning and scope of the claims are included in the present invention.

REFERENCE SIGNS LIST 1, 1b, 1c, 1d: current detection apparatus, 5: power conversion apparatus, 10: casing, 12a, 12b, 12c: power module, 15: clamp, 17: first support member, 20a, 20b, 20c: conductive member, 20m: main surface, 21a, 21b, 21c: bus bar, 22a, 22b, 22c: first conductive portion, 23a, 23b, 23c: second conductive portion, 25: second support member, 30: circuit board, 30a: first main surface, 30b: second main surface, 30s: side surface, 31: through-hole, 32: screw, 34a, 34b, 34c, 35a, 35b, 35c, 64a, 64b, 64c, 64d: slit, 36a, 36b, 36c: protrusion, 37a, 37b, 37c, 38a, 38b, 38c: side surface portion, 39a, 39b, 39c: leading end portion, 40a, 40b, 40c: magnetic field detection element, 43: first controller, 45a, 45b, 45c, 46a, 46b, 46c: wiring, 48a, 48b, 48c: impedance matching component, 50a, 50b, 50c: magnetic shield, 51a, 51b, 51c: first plate portion, 52a, 52b, 52c: second plate portion, 53a, 53b, 53c: third plate portion, 56a, 56b, 56c: first end, 57a, 57b, 57c: second end, 60a, 60b, 60c: current, 71a, 71b, 71c: first resin member, 72a, 72b, 72c: second resin member, 75a, 75b, 75c, 76a, 76b, 76c, 77a, 77b, 77c, 78a, 78b, 78c: groove, 80a, 80b, 80c: second controller, 85: load

The invention claimed is:
1. A current detection apparatus comprising:
a circuit board including a first main surface, a second main surface on an opposite side to the first main surface, and a side surface connected to the first main surface and the second main surface, the circuit board including one or more protrusions protruding from a plurality of side surface portions adjacent to the one or more protrusions of the side surface, respectively;
one or more magnetic field detection elements mounted on the first main surface, the one or more magnetic field detection elements being respectively mounted on the one or more protrusions, the one or more magnetic field detection elements being respectively configured to detect magnetic fields generated by currents flowing through one or more conductive members, the one or more conductive members extending in a first direction intersecting with the first main surface, the one or more conductive members being respectively opposed to leading end portions of the one or more protrusions; and
one or more magnetic shields respectively disposed opposite to the one or more protrusions, the one or more magnetic shields each including one or more first plate portions, one or more second plate portions, and one or more third plate portions, the one or more second plate portions being respectively opposed to the one or more first plate portions, the one or more third plate portions respectively connecting the one or more first plate portions and the one or more second plate portions, wherein the one or more first plate portions, the one or more second plate portions, and the one or more third plate portions are opposed to the side surface of the one or more protrusions, and in planar view of the first main surface, the one or more protrusions, the one or more magnetic field detection elements, and the one or more conductive members are respectively surrounded by the one or more magnetic shields.

2. The current detection apparatus according to claim 1, wherein the one or more protrusions are a plurality of the protrusions, the one or more conductive members are a plurality of the conductive members, the one or more magnetic field detection elements are a plurality of the magnetic field detection elements, and the one or more magnetic shields are a plurality of the magnetic shields.

3. The current detection apparatus according to claim 2, wherein the circuit board includes a controller, and the controller is electrically connected to the plurality of magnetic field detection elements.

4. The current detection apparatus according to claim 3, wherein the circuit board includes one or more impedance matching components, and the one or more impedance matching components are disposed between the controller and the plurality of magnetic field detection elements.

5. The current detection apparatus according to claim 1, wherein in planar view of the first main surface, the first main surface extends in a second direction and in a third direction orthogonal to the second direction, in planar view of the first main surface, the one or more magnetic field detection elements are separated from the one or more conductive members in the second direction, respectively, the one or more magnetic field detection elements each have first magnetic field sensitivity along the second direction and second magnetic field sensitivity along the third direction, and the second magnetic field sensitivity is larger than the first magnetic field sensitivity.

6. The current detection apparatus according to claim 5, wherein the one or more conductive members each include one or more first conductive portions extending along the first direction and one or more second conductive portions extending along the second direction, the one or more second conductive portions are respectively connected to the one or more first conductive portions, and the one or more magnetic field detection elements respectively overlap the one or more second conductive portions in planar view of the first main surface.

7. The current detection apparatus according to claim 1, wherein the one or more first plate portions each include one or more first ends, the one or more second plate portions each include one or more second ends, and the one or more first ends and the one or more second ends abut on the plurality of side surface portions.

8. The current detection apparatus according to claim 1, wherein a plurality of slits are formed in the side surface of the circuit board, each of the one or more protrusions is provided between the plurality of slits, and the one or more first plate portions and the one or more second plate portions are press-fit into the plurality of slits.

9. The current detection apparatus according to claim 8, further comprising:

a second support member to which the one or more magnetic shields are fixed; and a casing to which the second support member is fixed, wherein the circuit board is fixed to the casing with the one or more magnetic shields and the second support member interposed therebetween.

10. The current detection apparatus according to claim 1, further comprising:

one or more first resin members; and one or more second resin members, wherein the one or more first resin members respectively cover the one or more first plate portions, the one or more second resin members respectively cover the one or more second plate portions, a plurality of slits are formed in the side surface of the circuit board, each of the one or more protrusions is provided between the plurality of slits, the one or more first resin members and the one or more second resin members are press-fit into the plurality of slits, the one or more first resin members are in contact with the side surface, the first main surface, and the second main surface, and the one or more second resin members are in contact with the side surface, the first main surface, and the second main surface.

11. The current detection apparatus according to claim 10, further comprising:

a second support member to which the one or more magnetic shields are fixed; and a casing to which the second support member is fixed, wherein the circuit board is fixed to the casing with the one or more magnetic shields and the second support member interposed therebetween.

12. The current detection apparatus according to claim 1, further comprising:

a plurality of first support members to which at least one of the first main surface and the second main surface is fixed; and a casing to which the plurality of first support members are fixed, wherein the circuit board is fixed to the casing with the plurality of first support members interposed therebetween.

13. A power conversion apparatus comprising:

the current detection apparatus according to claim 1; and one or more power modules, wherein the one or more power modules are respectively connected to the one or more conductive members.

* * * * *